US012501644B2

(12) United States Patent
Wang et al.

(10) Patent No.: US 12,501,644 B2
(45) Date of Patent: Dec. 16, 2025

(54) GALLIUM NITRIDE-BASED DEVICE WITH STEP-WISE FIELD PLATE AND METHOD MAKING THE SAME

(71) Applicant: Taiwan Semiconductor Manufacturing Co., Ltd., Hsin-Chu (TW)

(72) Inventors: Wei Wang, Hsinchu (TW); Wei-Chen Yang, Hsinchu (TW); Yao-Chung Chang, Zhubei (TW); Ru-Yi Su, Yunlin County (TW); Yen-Ku Lin, Hsinchu (TW); Chuan-Wei Tsou, Hsinchu (TW); Chun Lin Tsai, Hsin-Chu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 363 days.

(21) Appl. No.: 17/343,153

(22) Filed: Jun. 9, 2021

(65) Prior Publication Data

US 2022/0037518 A1 Feb. 3, 2022

Related U.S. Application Data

(60) Provisional application No. 63/059,431, filed on Jul. 31, 2020.

(51) Int. Cl.
*H10D 30/47* (2025.01)
*H10D 30/01* (2025.01)
(Continued)

(52) U.S. Cl.
CPC ....... *H10D 30/4755* (2025.01); *H10D 30/015* (2025.01); *H10D 62/824* (2025.01);
(Continued)

(58) Field of Classification Search
CPC ............ H01L 29/7787; H01L 29/2003; H01L 29/205; H01L 29/401; H01L 29/402; H01L 29/66462
See application file for complete search history.

(56) References Cited

U.S. PATENT DOCUMENTS

2012/0193637 A1\* 8/2012 Kalnitsky ............ H10D 30/015
257/E21.451
2014/0264369 A1\* 9/2014 Padmanabhan ...... H10D 86/011
438/172

(Continued)

FOREIGN PATENT DOCUMENTS

CN 102623490 A 8/2012
CN 104332498 A 2/2015
(Continued)

*Primary Examiner* — Jay C Kim
*Assistant Examiner* — Woo K Lee
(74) *Attorney, Agent, or Firm* — HAYNES AND BOONE, LLP

(57) ABSTRACT

The present disclosure provides a semiconductor structure. The semiconductor structure includes a gallium nitride (GaN) layer on a substrate; an aluminum gallium nitride (AlGaN) layer disposed on the GaN layer; a gate stack disposed on the AlGaN layer; a source feature and a drain feature disposed on the AlGaN layer and interposed by the gate stack; a dielectric material layer is disposed on the gate stack; and a field plate disposed on the dielectric material layer and electrically connected to the source feature, wherein the field plate includes a step-wise structure.

20 Claims, 24 Drawing Sheets

(51) Int. Cl.
  *H10D 62/824* (2025.01)
  *H10D 62/85* (2025.01)
  *H10D 64/00* (2025.01)
  *H10D 64/01* (2025.01)

(52) U.S. Cl.
  CPC ......... *H10D 62/8503* (2025.01); *H10D 64/01* (2025.01); *H10D 64/111* (2025.01)

(56) References Cited

U.S. PATENT DOCUMENTS

| | | |
|---|---|---|
| 2014/0361342 A1 | 12/2014 | Sriram et al. |
| 2017/0077282 A1 | 3/2017 | Lee et al. |
| 2017/0338316 A1 | 11/2017 | Yao et al. |
| 2018/0026107 A1 | 1/2018 | Shimizu et al. |

FOREIGN PATENT DOCUMENTS

| | | | |
|---|---|---|---|
| JP | 2015170821 | * | 9/2015 |
| JP | 2015170821 A | | 9/2015 |
| JP | 2018117114 A | | 7/2018 |
| KR | 20130035477 A | | 4/2013 |
| KR | 20170033219 A | * | 3/2017 |

* cited by examiner

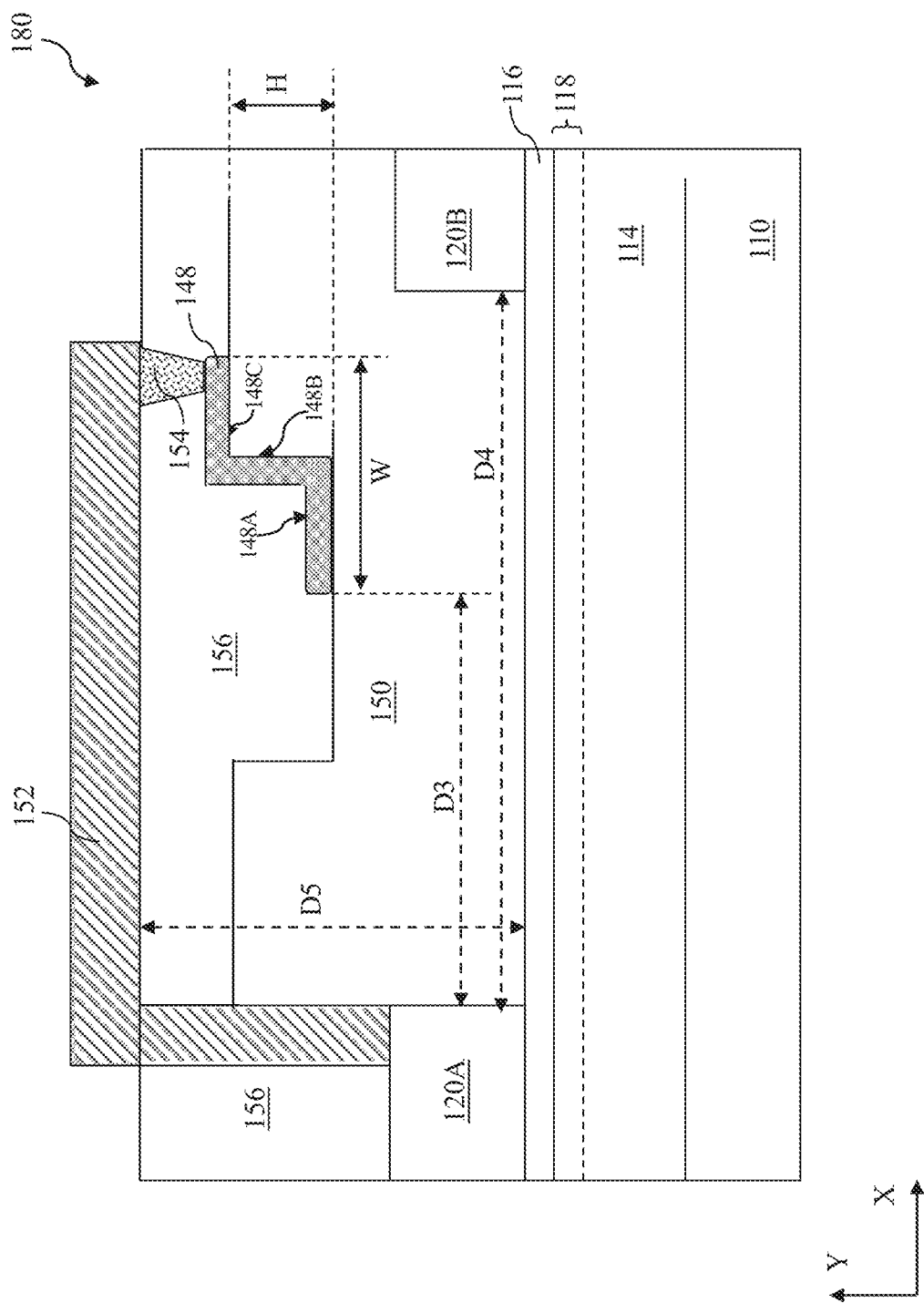

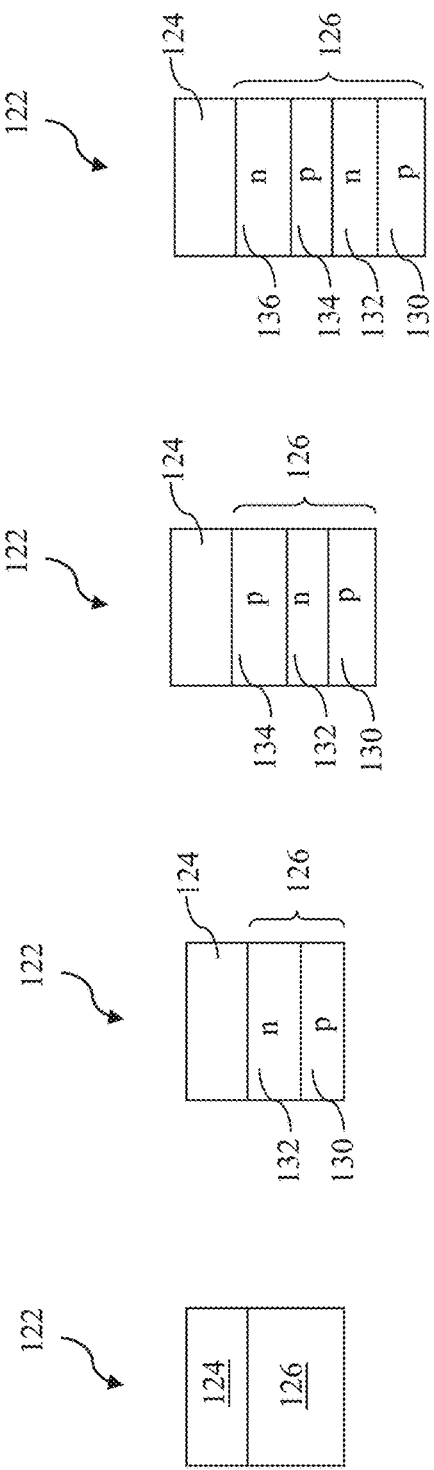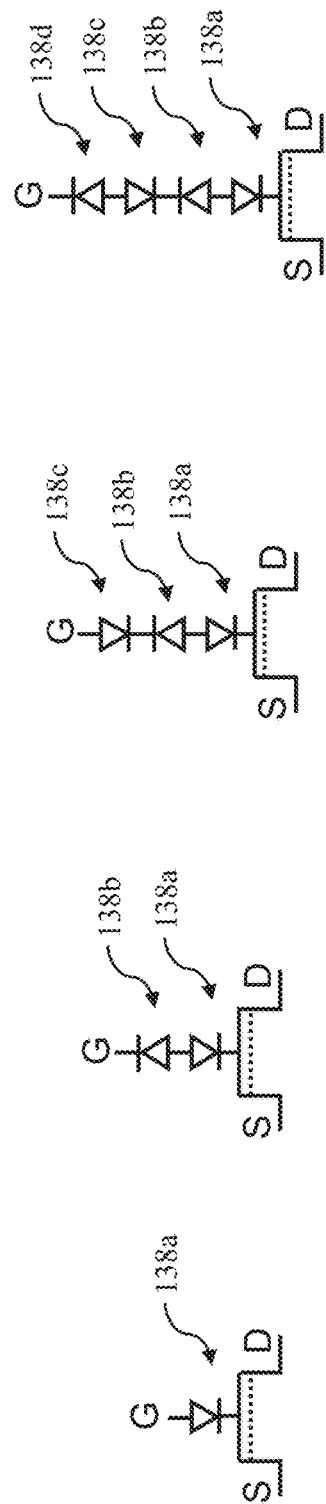

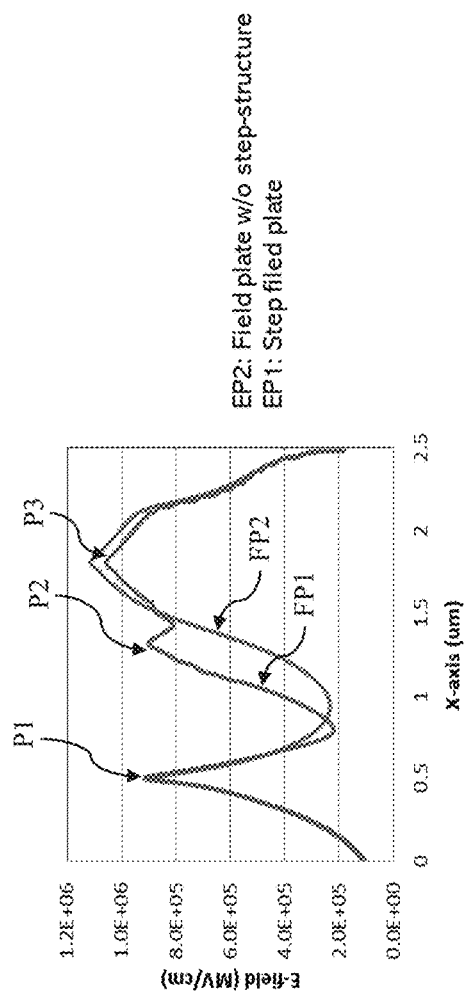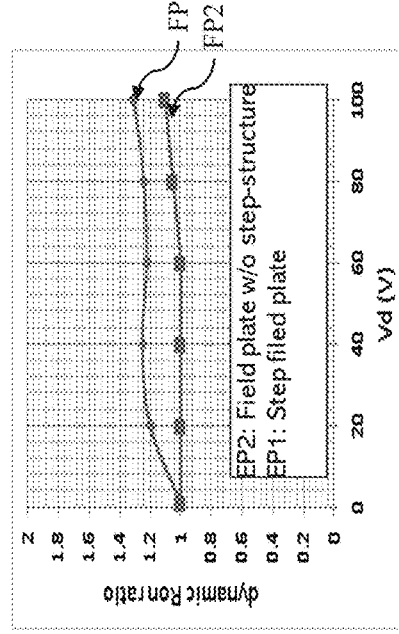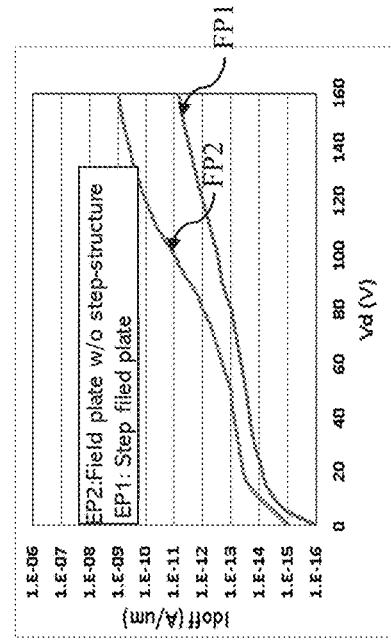
Fig. 28

GALLIUM NITRIDE-BASED DEVICE WITH STEP-WISE FIELD PLATE AND METHOD MAKING THE SAME

PRIORITY DATA

This application claims priority to U.S. Provisional Patent Application No. 63/059,431 filed on Jul. 31, 2020, entitled "GALLIUM NITRIDE DEVICE WITH STEP-FIELD PLATE AND PERFORMANCE ENHANCEMENT", the entire disclosure of which is hereby incorporated herein by reference.

BACKGROUND

In semiconductor technology, due to its characteristics, gallium nitride (GaN) is used to form various integrated circuit devices, such as high-power field-effect transistors, high frequency transistors, or high electron mobility transistors (HEMTs). In some examples, a GaN-based device is used in an integrated circuit for high breakdown voltage and low on-resistance. However, breakdown voltage is related to various factors. The existing GaN-based device is far from satisfactory considering breakdown voltage and other device parameters, including threshold voltage. Therefore, a structure for a GaN-based device with enhanced breakdown voltage to address the above concerns and a method of making the same are needed.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 1b is a sectional view of a semiconductor structure having a gallium nitride (GaN)-based device constructed in accordance with some embodiments;

FIGS. 2a, through 8a are sectional views of a gate structure incorporated in the semiconductor structure of FIG. 1a according to various embodiments;

FIGS. 2b, through 8b are schematic views of the semiconductor structure of FIG. 1a with the gate stack of FIGS. 2a through 8a, respectively, according to various embodiments;

FIG. 28 is a diagrammatic view of various characteristic data of the gallium nitride GaN-based device according to some embodiments.

DETAILED DESCRIPTION

Figure 1A:
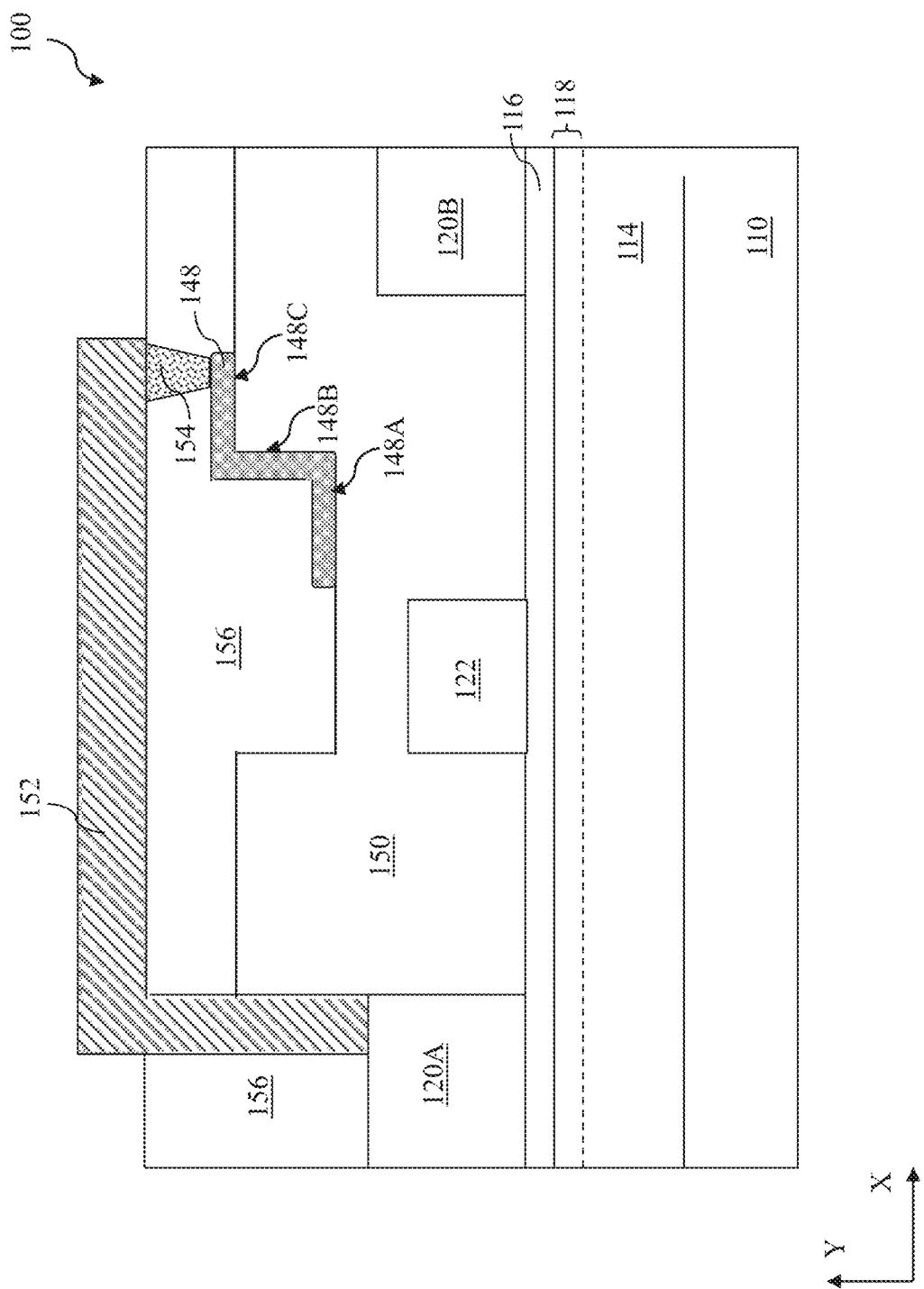
FIG. 1a is a sectional view of a semiconductor structure having a gallium nitride (GaN)-based transistor constructed in accordance with some embodiments.

It is understood that the following disclosure provides many different embodiments, or examples, for implementing different features of various embodiments. Specific examples of components and arrangements are described below to simplify the present disclosure. These are, of course, merely examples and are not intended to be limiting. The present disclosure may repeat reference numerals and/or letters in the various examples. This repetition is for the purpose of simplicity and clarity and does not in itself dictate a relationship between the various embodiments and/or configurations discussed.

FIG. 1a is a sectional view of one embodiment of a semiconductor structure (or a device structure) 100 having a gallium nitride (GaN)-based transistor. FIG. 1b is a sectional view of one embodiment of a semiconductor structure 180 having a GaN-based device. FIGS. 2a through 8a are sectional views of a gate structure incorporated in the semiconductor structure of FIG. 1a according to various embodiments of the present disclosure. FIGS. 2b through 8b are schematic views of the semiconductor structure of FIG. 1a having the gate structure of FIGS. 2a through 8a, respectively, according to various embodiments of the present disclosure. With reference to FIG. 1a, FIG. 1b, FIGS. 2a through 8a, FIGS. 2b through 8b, and other figures, the GAN-based device, such as the semiconductor structure 100 (or 180), and a method of making the same are collectively described.

Referring to FIG. 1a, the semiconductor structure 100 includes a sapphire substrate 110. Alternatively, the substrate may be a silicon carbide (SiC) substrate or a silicon substrate. For example, the silicon substrate may be a (111) silicon wafer.

The semiconductor structure 100 also includes a heterojunction formed between two different semiconductor material layers, such as material layers with different band gaps. For example, the semiconductor structure 100 includes a non-doped narrow-band gap channel layer and a wide-band gap n-type donor supply layer. In one embodiment, the semiconductor structure 100 includes a first III-V compound layer (or referred to as a buffer layer) 114 formed on the substrate 110 and a second III-V compound layer (or referred to as a barrier layer) 116 formed on the buffer layer 114. The buffer layer 114 and the barrier layer 116 are compounds made from the III-V groups in the periodic table of elements. However, the buffer layer 114 and the barrier layer 116 are different from each other in composition. The buffer layer 114 is undoped or unintentionally doped (UID). In the present embodiment of the semiconductor structure 100, the buffer layer 114 includes a gallium nitride (GaN) layer (also referred to as the GaN layer 114). The barrier layer 116 includes an aluminum gallium nitride (AlGaN) layer (also referred to as AlGaN layer 116). The GaN layer 114 and AlGaN layer 116 may directly contact each other in some embodiments.

In the depicted embodiment, the GaN layer 114 is undoped. Alternatively, the GaN layer 114 is unintentionally doped, such as lightly doped with n-type due to a precursor used to form the GaN layer 114. The GaN layer 114 can be epitaxy grown by metal organic vapor phase epitaxy (MOVPE) using gallium-containing precursor and nitrogen-containing precursor. The gallium-containing precursor includes trimethylgallium (TMG), triethylgallium (TEG), or other suitable chemical. The nitrogen-containing precursor includes ammonia ($NH_3$), tertiarybutylamine (TBAm), phenyl hydrazine, or other suitable chemical. In one example, the GaN layer 114 has a thickness ranging between about 0.5 micron and about 10 microns. In another example, the GaN layer 114 has a thickness of about 2 microns.

The AlGaN layer 116 is n-type doped, such as lightly n-type doped. Alternatively, or additionally, the AlGaN layer 116 has n-type dopant introduced from an adjacent layer. In some embodiments, the AlGaN layer 116 is p-type doped, such as lightly p-type doped. The AlGaN layer 116 is deposited on the GaN layer 114 by selectively epitaxy growth. The AlGaN layer 116 can be epitaxially grown by MOVPE using aluminum-containing precursor, gallium-containing precursor, and nitrogen-containing precursor. The aluminum-containing precursor includes TMA, TEA, or other suitable chemical. The gallium-containing precursor includes TMG, TEG, or other suitable chemical. The nitrogen-containing precursor includes ammonia, TBAm, phenyl hydrazine, or other suitable chemical. In one example, the AlGaN layer 116 has a thickness ranging between about 5 nanometers and about 50 nanometers. In another example, the AlGaN layer 116 has a thickness of about 15 nanometers.

The electrons in the AlGaN layer 116 drop into the GaN layer 114, creating a very thin layer 118 of highly mobile conducting electrons in the GaN layer 114. This thin layer 118 is referred to as a two-dimensional electron gas (2-DEG), forming a carrier channel. The thin layer 118 of 2-DEG is located at the interface of the AlGaN layer 116 and the GaN layer 114. Thus, the carrier channel has high electron mobility because the GaN layer 114 is undoped or unintentionally doped, and the electrons can move freely without collision with the impurities or substantially reduced collision.

The semiconductor structure 100 also includes a source feature 120A and a drain feature 120B formed on the substrate 110 and configured to electrically connect to the channel layer 118. The source feature 120A and the drain feature 120B are also collectively referred to as source/drain (S/D) features 120. The S/D features 120 include one or more conductive materials. For example, the S/D features 120 include one metal selected from the group consisting of titanium, aluminum, nickel, and gold. The S/D features 120 can be formed by a process such as physical vapor deposition (PVD) or other proper technique. A thermal annealing process may be applied to the S/D features 120 such that the S/D features 120 and the AlGaN layer 116 react to form an alloy for effective electrical connection from the S/D features 120 and the channel with ohmic contact. As one example, a rapid thermal annealing (RTA) apparatus and process are utilized for the thermal annealing.

A gate stack 122 is formed on the barrier layer 116 and is interposed between the source and drain features 120. In some embodiments, the gate stack 122 includes a junction isolation feature disposed on the barrier layer (the AlGaN layer in the present embodiment) 116. The junction isolation feature includes at least one doped semiconductor layer so that to form a p-n junction with the barrier layer 116. In the depicted embodiment, the junction isolation feature includes at least one p-type doped III-V compound while the barrier layer 116 is n-type doped. In furtherance of the embodiment, the p-type doped III-V compound layer is a p-type doped GaN (p-GaN) layer, in which GaN is doped by a p-type dopant, such as magnesium, calcium, zinc beryllium, carbon, or combinations thereof. The dopant concentration ranges between $10^{19}$ cm$^{-3}$ and $10^{21}$ cm$^{-3}$, according to some embodiments. In the depicted embodiment, the junction isolation feature of p-GaN and the barrier layer 116 of n-AlGaN are configured to form a p-n junction to provide isolation and a capacitive coupling to the channel layer 118. In some embodiments, the gate stack 122 includes a conductive material layer, such as metal, metal alloy, other suitable conductive material or a combination thereof, disposed on the junction isolation feature and functioning as gate electrode. The conductive material layer is configured for voltage bias and electrical coupling with the channel layer.

In some examples, the gate stack 122 includes at least one n-type doped semiconductor layer and one p-type doped semiconductor layer to form a diode, which may be an n-type doped III-V compound layer and a p-type doped III-V compound layer, respectively. In furtherance of the example, the n-type doped III-V compound layer and the p-type doped III-V compound layer are an n-type doped GaN layer (or n-GaN layer) and a p-type doped GaN layer (p-GaN layer), respectively. The diode in the gate stack provides a junction isolation effect. In the present embodiment, the gate stack 122, the S/D features 120, and the 2-DEG channel in the buffer layer 114 are configured as a GaN-based transistor. Particularly, the thus configured transistor is also referred to as a high electron mobility transistor (HEMT).

FIGS. 2a through 8a illustrate various embodiments of the gate stack 122 of the semiconductor structure 100 constructed according to various aspects of the present disclosure. The gate stack 122 is further described according to various embodiments. In one embodiment illustrated in FIG. 2a, the gate stack 122 includes a metal layer 124 and a junction isolation feature 126 disposed underlying the metal layer 124. The metal layer 124 may include any suitable metal or metal alloy, such as copper, aluminum, tungsten, nickel, cobalt, other suitable metal or a combination thereof. The junction isolation feature 126 includes at least one doped semiconductor layer so that to form a p-n junction with the AlGaN layer 116. In the depicted embodiment, the junction isolation feature 126 includes at least one p-type doped semiconductor layer while the AlGaN layer 116 is n-type doped. In furtherance of the embodiment, the p-type doped III-V compound layer is a p-type doped GaN layer (p-GaN layer).

Illustrated in FIG. 2b is a schematic view of the GaN-based transistor of the semiconductor structure 100 having the gate stack 122 of FIG. 2a. In FIG. 2b, "G", "S", and "D" represent gate, source, and drain, respectively. The 2-DEG channel is defined between the source and drain. A diode 138a is formed between the p-GaN layer 130 and the barrier layer 116 having n-type dopant. The resultant capacitance from the diodes 138a is reduced while the device switching speed is increased.

Alternatively, the junction isolation feature 126 may further include another n-type doped GaN layer, another p-type doped GaN layer, or both. A junction (or diode) is formed between each paired adjacent n-GaN layer and p-GaN layer. Various diodes among the n-GaN and p-GaN layers are electrically configured in series. Those diodes not only provide isolation to the gate electrode from the channel with reduced gate leakage but also improve device switching speed as explained below. Since the various diodes are coupled in series, the corresponding capacitors are coupled in series as well. Therefore, the total capacitance of the capacitors in series will be less than any one of them. Accordingly, the device switching speed is improved due to the reduced capacitance.

In one embodiment, the interface between the metal layer and the diode is an Ohmic contact formed by a thermal annealing with an annealing temperature ranging between about 800° C. and about 900° C. In another embodiment, the interface between the metal layer and the diode is a Schottky contact. In this case, the process to form the gate stack is without the thermal annealing.

In one embodiment illustrated in FIG. 3a, the junction isolation feature 126 of the gate stack 122 includes a p-GaN layer 130 and an n-GaN layer 132 disposed on the p-GaN layer 130. The p-GaN layer 130 is doped by a p-type dopant, such as magnesium, calcium, zinc beryllium, carbon, or combinations thereof. In one embodiment, the p-GaN layer 130 can be formed by MOCVD or other suitable technique. In another embodiment, the p-GaN layer 130 has a thickness ranging between about 1 nm and about 100 nm. The n-GaN layer 132 is doped by a n-type dopant, such as silicon, oxygen, or a combination thereof. In one embodiment, the n-GaN layer 132 can be formed by MOCVD or other suitable technique. In another embodiment, the n-GaN layer 132 has a thickness ranging between about 1 nm and about 100 nm.

Illustrated in FIG. 3b is a schematic view of the GaN-based transistor of the semiconductor structure 100 having the gate stack 122 of FIG. 3a. In FIG. 3b, "G", "S", and "D" represent gate, source, and drain, respectively. The 2-DEG channel is defined between the source and drain. A diode 138a is formed between the p-GaN layer 130 and the barrier layer 116 having n-type dopant. A second diode 138b is formed between the p-GaN layer 130 and the n-GaN layer 132. The diodes 138a and 138b are configured in series. The resultant capacitance from the diodes 138a and 138b is reduced while the device switching speed is increased.

In another embodiment illustrated in FIG. 4a, the junction isolation feature 126 of the gate stack 122 is similar to the junction isolation feature 126 in FIG. 3a but further includes an additional p-GaN layer 134 disposed on the n-GaN layer 132. The additional p-GaN layer 134 and the n-GaN layer 132 are configured to form another diode for additional isolation effect. The additional p-GaN layer 134 is similar to the p-GaN layer 130 in terms of composition and formation. For example, the p-GaN layer 134 is doped by a p-type dopant, such as magnesium, calcium, zinc beryllium, carbon, or combinations thereof.

Illustrated in FIG. 4b is a schematic view of the GaN-based transistor of the semiconductor structure 100 having the gate stack 122 of FIG. 4a. Symbols "G", "S", and "D" represent gate, source, and drain, respectively. The 2-DEG channel is defined between the source and drain. A diode 138a is formed between the p-GaN layer 130 and the barrier layer 116 having n-type dopant. A second diode 138b is formed between the p-GaN layer 130 and the n-GaN layer 132. A third diode 138c is formed between the n-GaN layer 132 and the p-GaN layer 134. The diodes 138a, 138b, and 138c are configured in series. The resultant capacitance between the gate electrode and the channel from these diodes is further reduced while the device switching speed is further increased.

In another embodiment illustrated in FIG. 5a, the junction isolation feature 126 of the gate stack 122 is similar to the junction isolation feature 126 in FIG. 3a but further includes an additional p-GaN layer 134 disposed on the n-GaN layer 132 and an additional n-GaN layer 136 disposed on the p-GaN layer 134. The additional p-GaN layer 134 and the additional n-GaN layer 136 are similar to the p-GaN layer 130 and the n-GaN layer 132, respectively, in terms of composition and formation. For example, the n-GaN layer 136 is doped by a n-type dopant, such as silicon or oxygen.

Illustrated in FIG. 5b is a schematic view of the GaN-based transistor of the semiconductor structure 100 having the gate stack 122 of FIG. 5a. Symbols "G", "S", and "D" represent gate, source, and drain, respectively. The 2-DEG channel is defined between the source and drain. A diode 138a is formed between the p-GaN layer 130 and the barrier layer 116 having n-type dopant. A second diode 138b is formed between the p-GaN layer 130 and the n-GaN layer 132. A third diode 138c is formed between the n-GaN layer 132 and the p-GaN layer 134. A fourth diode 138d is formed between the p-GaN layer 134 and the n-GaN layer 136. The diodes 138a, 138b, 138c, and 138d are configured in series. The resultant capacitance between the gate electrode and the channel from these diodes is further reduced while the device switching speed is further increased thereby.

Figures 6A, 6B, 7A, 7B, 8A, 8B:
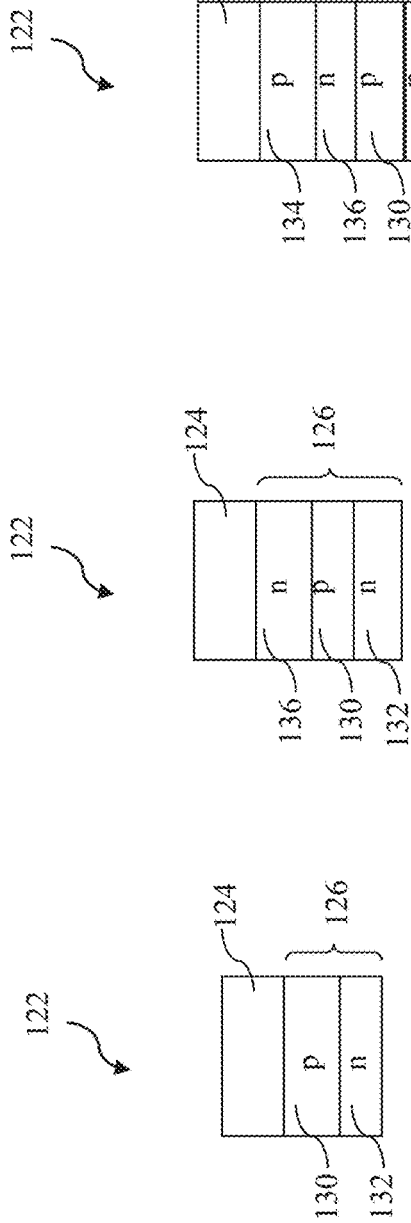

In one embodiment illustrated in FIG. 6a, the junction isolation feature 126 of the gate stack 122 includes a n-GaN layer 132 and a p-GaN layer 130 disposed on the n-GaN layer 132. The gate stack 122 of FIG. 5a is similar to the gate stack 122 of FIG. 3a but the p-GaN layer 130 and the n-GaN layer 132 are configured differently. The p-GaN layer 130 is doped by a p-type dopant, such as magnesium, calcium, zinc beryllium, carbon, or combinations thereof. In one embodiment, the p-GaN layer 130 can be formed by MOCVD or other suitable technique. In another embodiment, the p-GaN layer 130 has a thickness ranging between about 1 nm and about 100 nm. The n-GaN layer 132 is doped by a n-type dopant, such as silicon, oxygen, or a combination thereof. In one embodiment, the n-GaN layer 132 can be formed by MOCVD or other suitable technique. In another embodiment, the n-GaN layer 132 has a thickness ranging between about 1 nm and about 100 nm.

Illustrated in FIG. 6b is a schematic view of the GaN-based transistor of the semiconductor structure 100 having the gate stack 122 of FIG. 6a. A diode 138e is formed between the p-GaN layer 130 and the n-GaN layer 132 for isolation to prevent gate leakage.

In another embodiment illustrated in FIG. 7a, the junction isolation feature 126 of the gate stack 122 is similar to the junction isolation feature 126 in FIG. 3a but has a different configuration. Particularly, the n-GaN layer 132 is disposed on the barrier layer 116. The p-GaN layer 130 is disposed on the n-GaN layer 132. The additional n-GaN layer 136 is disposed on the p-GaN layer 130.

Illustrated in FIG. 7b is a schematic view of the GaN-based transistor of the semiconductor structure 100 having the gate stack 122 of FIG. 7a. One diode 138e is formed between the p-GaN layer 130 and the n-GaN layer 132. Another diode 138f is formed between the p-GaN layer 130 and the n-GaN layer 136. The diodes 138e and 138f are configured in series. The resultant capacitance between the gate electrode and the channel from these diodes provides isolation to prevent gate leakage and further enhances device switching speed.

In another embodiment illustrated in FIG. 8a, the junction isolation feature 126 of the gate stack 122 is similar to the junction isolation feature 126 in FIG. 5a but configured differently. The gate stack 122 in FIG. 8a includes the n-GaN layer 132 on the barrier layer 116, the p-GaN layer 130 on the n-GaN layer 132, the additional n-GaN layer 136 on the p-GaN layer 130 and the additional p-GaN layer 134 disposed on the additional n-GaN layer 136. Each of the n-GaN layers and the p-GaN layers is similar to the corresponding layer of the gate stack 122 in FIG. 4a in terms of composition and formation. For example, the n-GaN layer 136 is doped by a n-type dopant, such as silicon or oxygen.

Illustrated in FIG. 8b is a schematic view of the GaN-based transistor of the semiconductor structure 100 having the gate stack 122 of FIG. 8a. Symbols "G", "S", and "D" represent gate, source, and drain, respectively. The 2-DEG channel is defined between the source and drain. A diode 138e is formed between the n-GaN layer 132 and the p-GaN layer 130. A second diode 138f is formed between the p-GaN layer 130 and the additional n-GaN layer 136. A third diode 138g is formed between the n-GaN layer 136 and the additional p-GaN layer 134. The diodes 138e, 138f, and 138g are configured in series. The resultant capacitance between the gate electrode and the channel from these diodes is reduced while the device switching speed is further increased thereby.

Returning to FIG. 1a, the semiconductor structure 100 further includes a field plate 148 configured next to the gate stack 122 and designed to redistribute the electric field distribution, thereby to reduce surface field (RESURF) and increasing breakdown voltage. Other advantages may also be present, such as improving figure of merit (FOM), such as Qgd, Ronsp*Cgd, Ron*Coss, Ron*Ciss, Ron*Crss . . . etc., according to various embodiments. For example, the corresponding GaN-based transistors can be stabilized with reduced shift or no shift of the threshold voltage. In the depicted embodiment, the field plate 148 is disposed on a first dielectric material layer 150 and located between the gate stack 122 and the drain feature 120B. The field plate 148 extends from bottom of the trench toward the drain feature 120B, to the outside of the trench. Particularly, the field plate 148 is disposed to be horizontally distanced away from the drain 120B in the depicted embodiment. In other words, the field plate 148 is configured without overlapping with the drain 120B in the top view. The field plate 148 includes a conductive material, such as metal, metal alloy, silicide, other suitable conductive materials or a combination thereof. In some embodiments, the field plate 148 includes titanium nitride, titanium, titanium aluminum, aluminum copper or a combination thereof. In the depicted embodiment, the field plate 148 is electrically connected to the source feature 120A through conductive components 152 and 154 of an interconnect structure. Compared to a field plate connected to gate, source has stable voltage (0 V or Vss), which won't have trapping effect below the field plate. In some examples, the conductive component 152 may include a metal line and a via vertically extending from the source feature 120A to the metal line. The conductive component 154 may include a via extending from the field plate 148 to the conductive component 152. The conductive components 152 and 154 are at least partially embedded in another dielectric material layer 156.

Particularly, the field plate 148 has a step-wise structure (a step-structure) having at least three segments sequentially connected and alternatively oriented in different directions, such as two orthogonal directions (X and Y directions). In the depicted embodiment, the field plate 148 includes three segments, a first segment 148A extending horizontally (along X direction), a second segment 148B extending vertically (along Y direction) from the first segment 148A, and a third segment 148C extending horizontally (along X direction) from the second segment 148B. The disclosed step-wise structure of the field plate 148 can effectively reduce surface field and enhance breakdown voltage and have benefits to other performance parameters. In off state operation, the path from drain to source could have a huge voltage drop, and the peak e-field will show in boundaries (such as gate edge, field plate edge, metal edge . . . ). The more steps in the step-wise structure of the field plate 148 can provide more e-field peak, and sustain more voltage drop in the channel, which is the voltage drop between drain and source, and is an integral of the e-field. The structure and formation of the field plate 148 will be further described later in detail.

Turn to FIG. 1b as a sectional view of a semiconductor structure 180 having a gallium nitride GaN-based device constructed according to one or more other embodiments. The semiconductor structure 180 is similar to the semiconductor structure 100 in FIG. 1a. However, the semiconductor structure 180 includes a GaN-based device with two electrodes and not gate, also being referred to as GaN-based diode. The semiconductor structure 180 also includes a field plate 148 similarly configured between the source feature 120A and the drain feature 120B, and the filed plate 148 is electrically connected to the source feature 120A, such as through the conductive features 152 and 154. The field plate 148 extends from bottom of the trench toward the drain feature 120B, to the outside of the trench. Particularly, the field plate 148 is disposed to be horizontally distanced away from the drain 120B. In other words, the field plate 148 is configured without overlapping with the drain 120B in the top view.

Figure 9:
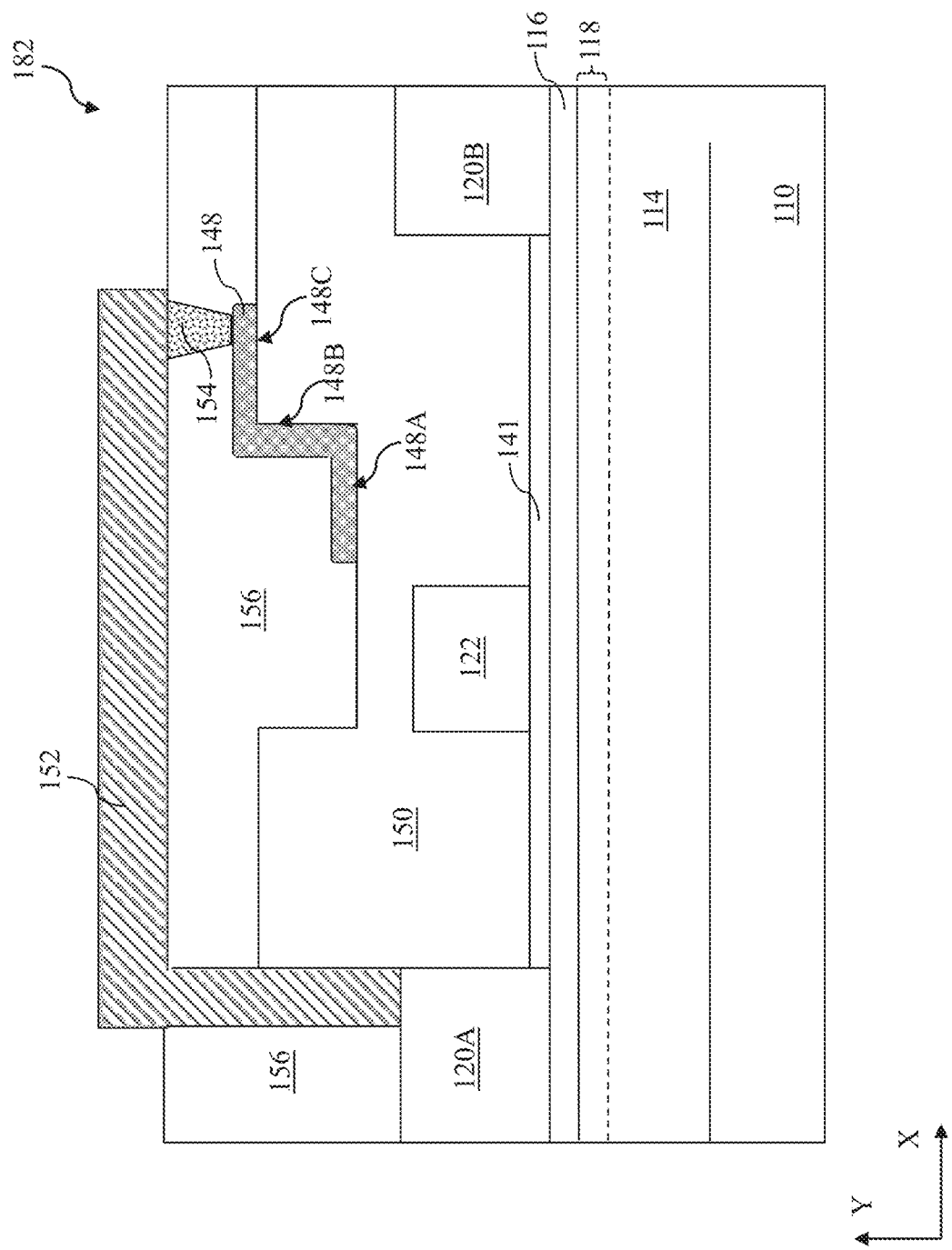
FIG. 9 is a sectional view of a semiconductor structure having a GaN-based transistor constructed in accordance with some embodiments.

FIG. 9 is a sectional view of a semiconductor structure 182 having a GaN-based transistor constructed according to one or more other embodiments. With reference to FIG. 9, FIGS. 2a through 8a, and FIGS. 2b through 8b, the semiconductor structure 182 and a method of making the same are collectively described.

The semiconductor structure 182 is similar to the semiconductor structure 100 of FIG. 1a but further includes a dielectric material layer (or insulating layer) 141 formed on the barrier layer 116 and disposed between the source feature 120A and the drain feature 120B. Particularly, the dielectric material layer 141 is formed between the barrier layer 116 and the gate stack 122. The dielectric material layer 141 includes a dielectric material selected from silicon oxide ($SiO_2$), silicon nitride ($Si_3N_4$), aluminum oxide ($Al_2O_3$), tantalum oxide ($Ta_2O_5$), titanium oxide ($TiO_2$), zinc oxide ($ZnO_2$), hafnium oxide ($HfO_2$) or combinations thereof, according to various examples. In one embodiment, the dielectric material layer 141 has a thickness ranging between about 3 nm and about 100 nm. The dielectric material layer 141 can be formed by any proper fabrication technique, such as chemical vapor deposition (CVD), PVD, atomic layer deposition (ALD), or thermal oxidation. The dielectric material layer 141 provides further isolation to prevent gate leakage and further improve device switching speed.

The gate stack 122 of FIG. 9 is similar to the gate stack 122 of FIG. 1a. For example, the gate stack 122 includes the junction isolation feature 126 disposed on the dielectric material layer 141 and the metal layer 124 disposed on the junction isolation feature 126. Furthermore, the gate stack 122 may have any one of the structures illustrated in FIGS. 2a through 8a according to various embodiments.

In FIG. 9, the semiconductor structure 182 also includes a field plate 148 configured next to the gate stack 122 and designed to redistribute the electric field distribution, thereby reducing surface field and increasing breakdown voltage. The field plate 148 is similar to the field plate 148 of FIG. 1a in terms of structure, configuration and formation. In the depicted embodiment, the field plate 148 is disposed on a dielectric material layer 150 and located between the gate stack 122 and the drain feature 120B. The field plate 148 extends from bottom of the trench toward the drain feature 120B, to the outside of the trench. Particularly, the field plate 148 is disposed to be horizontally distanced away from the drain 120B. In other words, the field plate 148 is configured without overlapping with the drain 120B in the top view. The field plate 148 includes a conductive material, such as metal, metal alloy, silicide, or other suitable conductive materials. In the depicted embodiment, the field plate 148 is electrically connected to the source feature 120A through conductive components 152 and 154 of an interconnect structure. Particularly, the field plate 148 has a step-wise structure having at least three segments sequentially connected and alternatively oriented in different directions, such as two orthogonal directions (X and Y directions). In the depicted embodiment, the field plate 148 includes three segments, a first segment 148A extending horizontally (along X direction), a second segment 148B extending vertically (along Y direction) from the first segment, and a third segment 148C extending horizontally (along X direction) from the second segment.

Figure 10:
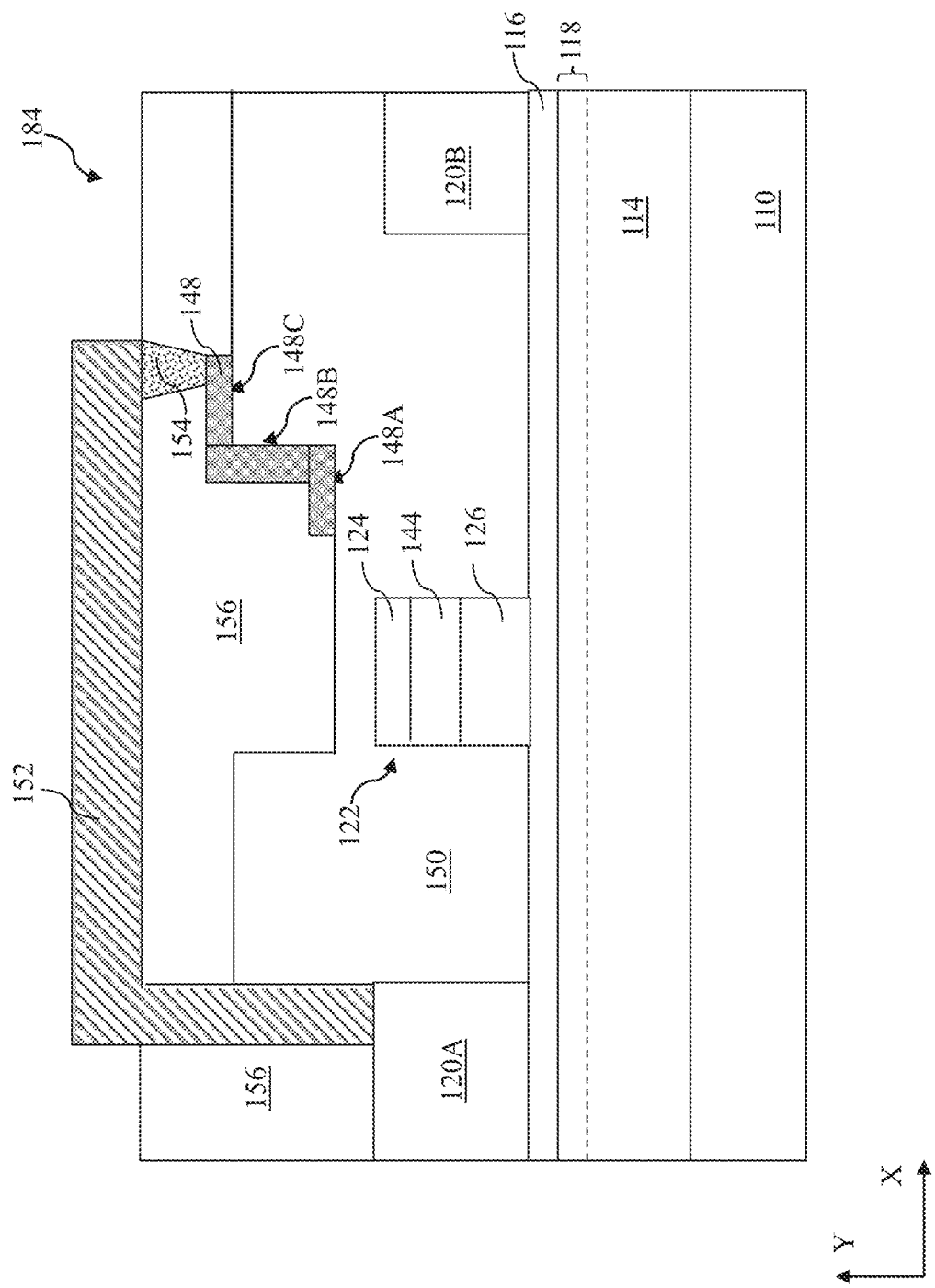
FIG. 10 is a sectional view of a semiconductor structure having a gallium nitride GaN-based transistor constructed in accordance with some embodiments.

FIG. 10 is a sectional view of one embodiment of a semiconductor structure 184 having a GaN-based transistor. The semiconductor structure 184 is similar to the semiconductor structure 100 of FIG. 1a but the gate stack 122 further includes a dielectric material layer (or insulating layer) 144 disposed between the metal layer 124 and the junction isolation feature 126. The dielectric material layer 144 includes a dielectric material selected from the group consisting of $SiO_2$, $Si_3N_4$, $Al_2O_3$, $Ta_2O$, $TiO_2$, $ZnO_2$, $HfO_2$, or combinations thereof, according to various examples. In one embodiment, the dielectric material layer 144 has a thickness ranging between about 3 nm and about 100 nm. The dielectric material layer 144 may be formed by any proper fabrication technique, such as CVD, PVD, ALD, or thermal oxidation. The dielectric material layer 144 provides further isolation to prevent gate leakage and further improve device switching speed. The junction isolation feature 126 may have a different structure, such as any one of those illustrated in FIGS. 2a-2b through 8a-8b.

The semiconductor structure 184 in FIG. 10 also includes a field plate 148 configured next to the gate stack 122 and designed to redistribute the electric field distribution, thereby reducing surface field and increasing breakdown voltage. The field plate 148 is similar to the field plate 148 of FIG. 1a in terms of structure, configuration and formation. In the depicted embodiment, the field plate 148 is disposed on a dielectric material layer 150 and located between the gate stack 122 and the drain feature 120B. The field plate 148 includes a conductive material, such as metal, metal alloy, silicide, or other suitable conductive materials, or a combination thereof. In the depicted embodiment, the field plate 148 is electrically connected to the source feature 120A through conductive components 152 and 154 of an interconnect structure. Particularly, the field plate 148 has a step-wise structure having at least three segments sequentially connected and alternatively oriented in different directions, such as two orthogonal directions (X and Y directions). In the depicted embodiment, the field plate 148 includes three segments, a first segment 148A extending horizontally (along X direction), a second segment 148B extending vertically (along Y direction) from the first segment 148A, and a third segment 148C extending horizontally (along X direction) from the second segment 148B.

Figure 11:
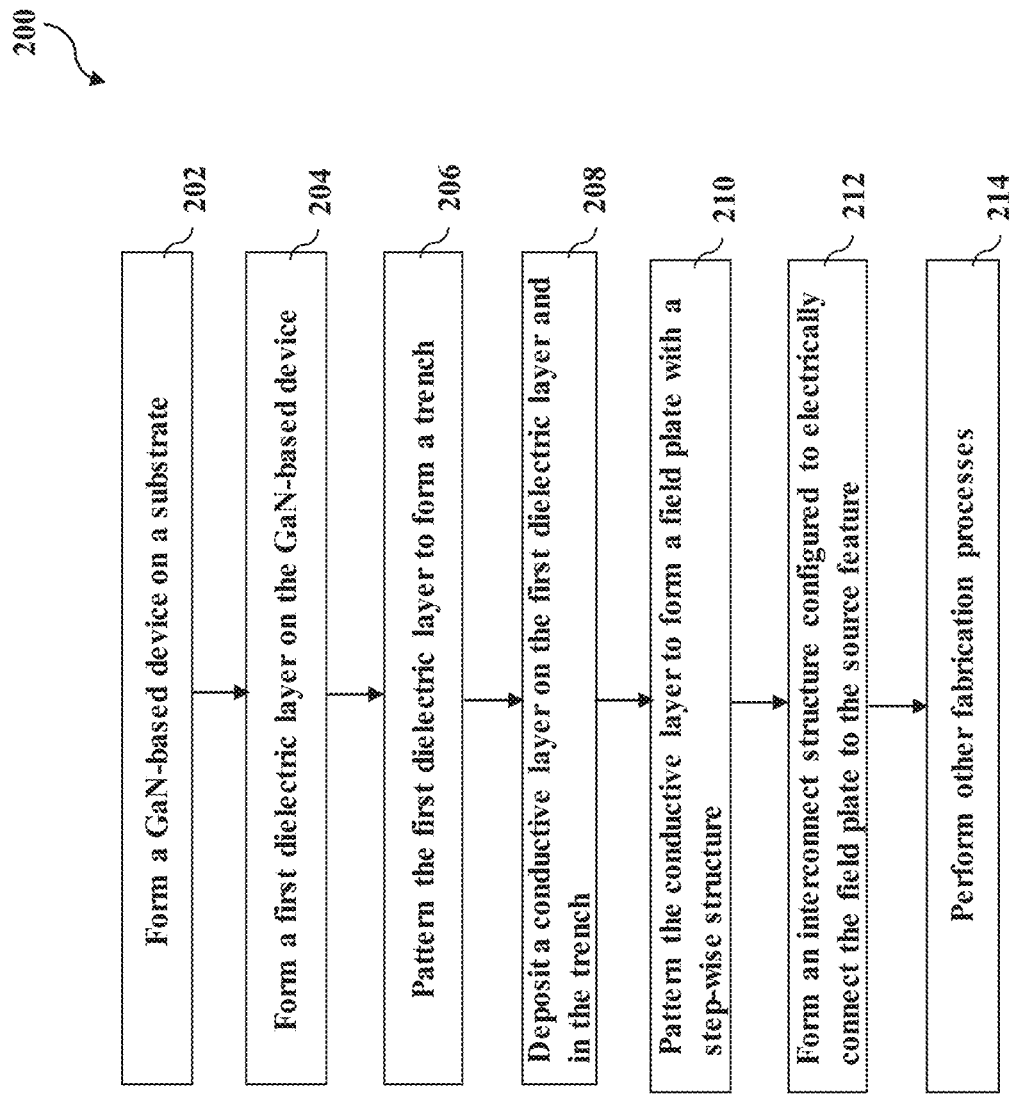
FIG. 11 is a flowchart of a method making a semiconductor structure, such as those of FIGS. 1a, 1b, 9 and 10 having a GaN-based device constructed in accordance with some embodiments.

FIG. 11 is a flowchart of a method 200 making a semiconductor structure having a III-V compound device, or particularly a GaN-based device, such as 100, 180, 182 or 184, in accordance with some embodiments. The method 200 includes a block 202 to form a III-V semiconductor compound-based device, such as a GaN-based transistor including the channel layer 118, the source feature 120A, the drain feature 120B and the gate stack 122, as described in FIG. 1a. At block 204, a first dielectric layer 150 is formed on the III-V semiconductor compound-based device by deposition (such as CVD) and additionally followed by a CMP process. At block 206, the first dielectric layer 150 is patterned to form a trench in the first dielectric layer 150. The block 206 may include one or more patterning processes to form the trench with desire profile such that to form the field plate 148 with desired step-wise structure. At 208, a conductive layer is deposited on the first dielectric layer 150 and in the trench of the first dielectric layer 150 by a suitable deposition, such as PVD. At 210, the conductive layer is patterned to form the field plate 148 with a step-wise structure. The field plate 148 extends from bottom of the trench toward the drain feature 120B, to the outside of the trench. At 212, an interconnect structure is formed on the III-V semiconductor compound-based device and the field plate 148 such that the field plate 148 is electrically connected to the source feature 120A. The method 200 may further include other fabrication processes at block 214 implemented before, during and/or after the above operations.

FIGS. 12 through 19 are sectional views of the semiconductor structure 100 at various fabrication stages in accordance with some embodiments. The method 200 making a III-V compound-based device is described below in details with reference to those figures. The semiconductor structure 100 is used as an exemplary structure made by the method 200.

Figure 12:
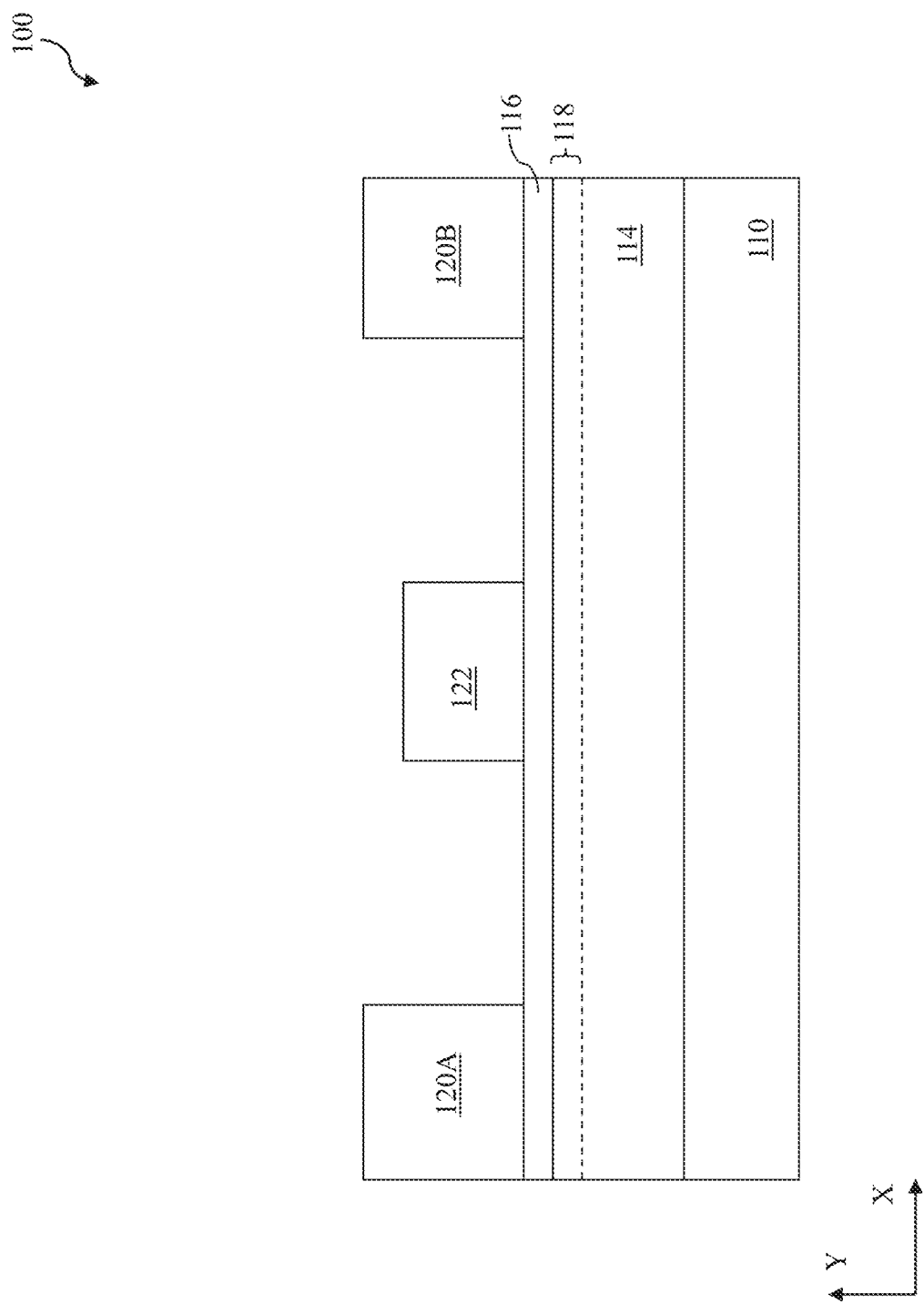
FIGS. 12 through 19 are sectional views of a semiconductor structure (such as those of FIGS. 1a, 9 and 10) at various fabrication stages according to various embodiments.

Referring to FIG. 12, a III-V semiconductor compound-based device, such as a GaN-based transistor, is formed on the substrate 110. The III-V semiconductor compound-based device includes the channel layer 118, the source feature 120A, the drain feature 120B and the gate stack 122 configured to form a functional field-effect transistor. The structure and formation of a III-V semiconductor compound-based device are described in FIG. 1a. Especially, the gate stack 122 may have a different structure, such as those illustrated in FIGS. 1a, 2a-8b and 9-10.

Figure 13:
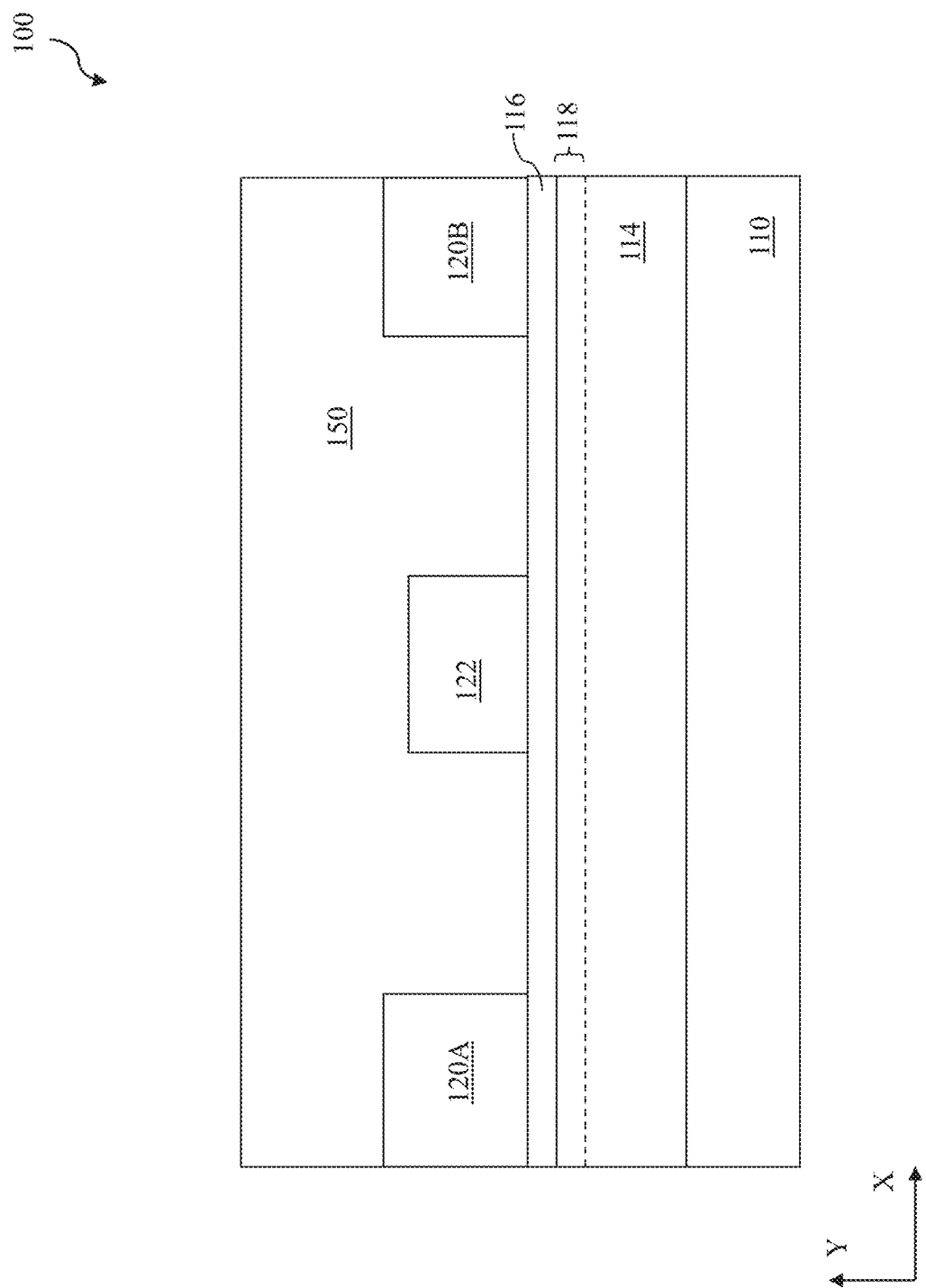

Referring to FIG. 13, a first dielectric layer 150 is formed on the III-V semiconductor compound-based device by deposition, such as CVD, flowable CVD (CVD), spin coating, ALD, other suitable deposition or a combination thereof, The first dielectric layer 150 includes one or more dielectric materials, such as silicon oxide, silicon nitride, a low k dielectric material, other suitable dielectric material, or a combination thereof. In some embodiments, the formation of the first dielectric layer 150 includes deposition and CMP.

Figure 14:
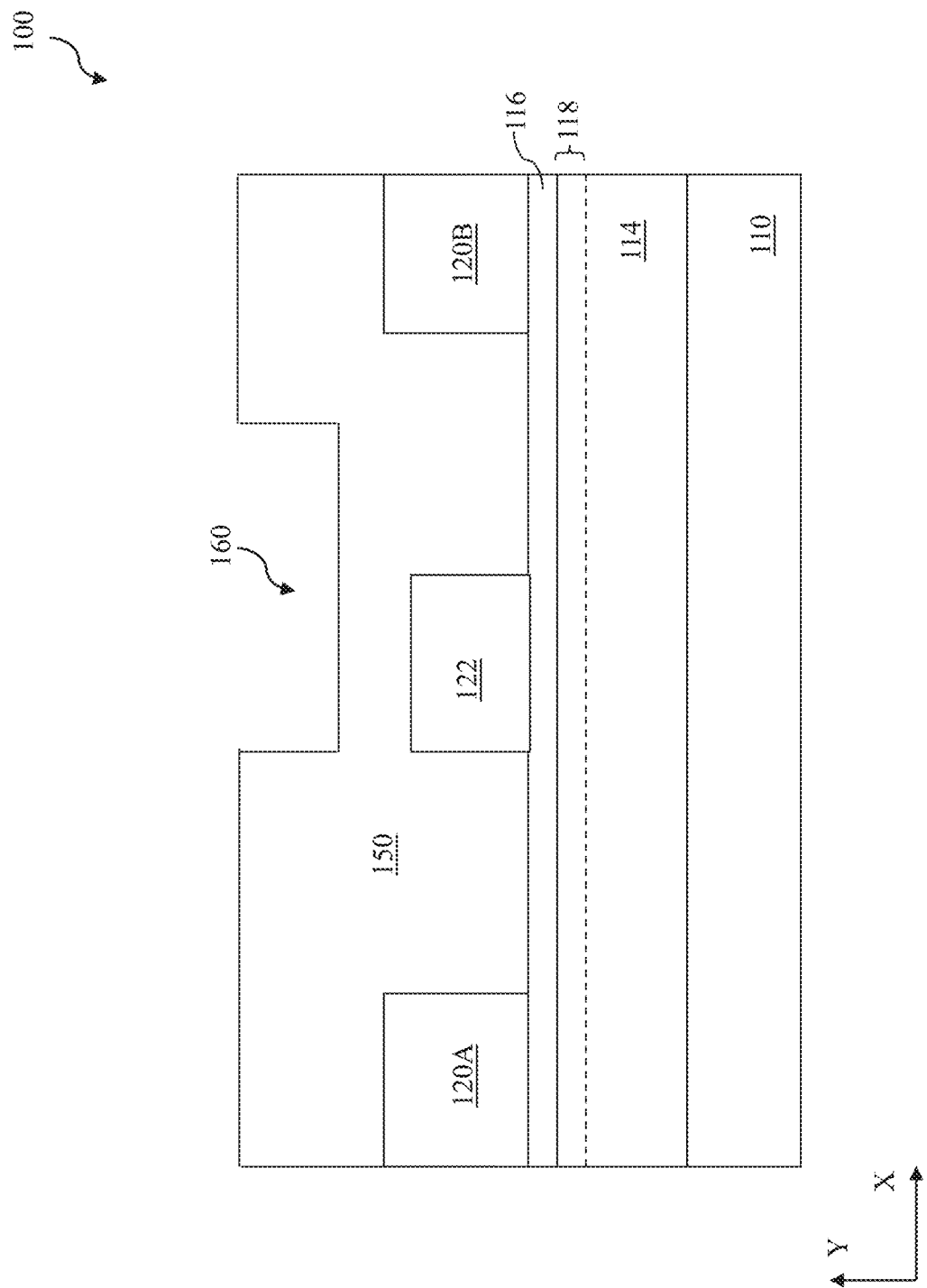

Referring to FIG. 14, a first dielectric layer 150 is patterned to form a trench 160 in the first dielectric layer 150. The operation for patterning the first dielectric layer 150 may include one, two or more patterning processes applied to the first dielectric layer 150 to form the trench 160 with desire profile such that the field plate 148 is subsequently formed with desired step-wise structure. For example, the first dielectric layer 150 may be patterned twice, three times or more so that the trench 160 includes a step-wise profile. The patterning process may include forming a hard mask and applying an etch process to the first dielectric layer 150 through the openings of the hard mask to form trenches in the first dielectric layer 150. The hard mask may be formed by a procedure that includes depositing a hard mask material layer, and etching the hard mask material layer through the openings of the patterned photoresist layer. In some examples, the hard mask material layer includes a silicon oxide and a silicon nitride subsequently deposited on the first dielectric layer 150. The hard mask layer may be formed by thermal oxidation, CVD, ALD, or any other appropriate method. The procedure to form the hard mask further includes forming a patterned photoresist (resist) layer by a lithography process, and etching the hard mask material layer through the openings of the patterned resist layer to transfer the openings to the hard mask material layer. An exemplary lithography process may include forming a resist layer, exposing the resist by a lithography exposure process, performing a post-exposure bake process, and developing the photoresist layer to form the patterned photoresist layer. The lithography process may be alternatively replaced by other technique, such as e-beam writing, ion-beam writing, mask-less patterning or molecular printing. In some other embodiments, the patterned photoresist layer may be directly used as an etch mask for the etch process to form the trenches. The etching process may include dry etch, wet etch or a combination thereof with one or more suitable etchant to etch the first dielectric layer 150.

Figure 15:
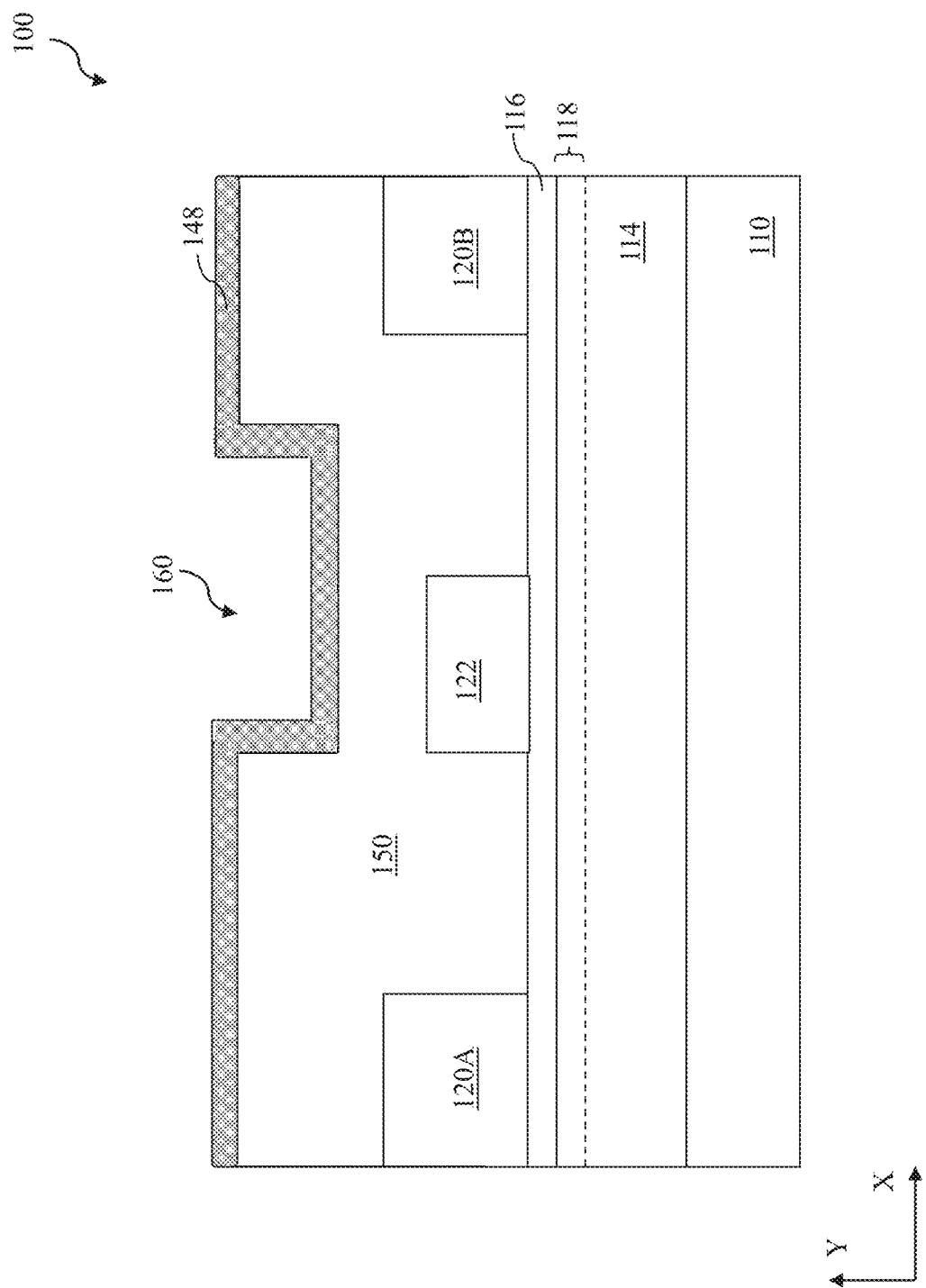

Referring to FIG. 15, a conductive layer 148 is deposited on the first dielectric layer 150 and in the trench 160 of the first dielectric layer 150 by a suitable deposition, such as PVD. The conductive layer 148 includes a conductive material, such as metal, metal alloy, silicide, other suitable conductive materials or a combination thereof. In some embodiments, the conductive layer 148 includes titanium nitride, titanium, titanium aluminum, aluminum copper or a combination thereof. In yet some embodiments, the conductive layer 148 includes two or more conductive material layers, such as a barrier layer and a fill metal layer. In furtherance of the embodiments, the barrier layer includes titanium nitride and titanium, or tantalum nitride and tantalum, and the fill metal layer includes aluminum copper, aluminum, tungsten, other suitable metal or a combination thereof.

Figure 16:
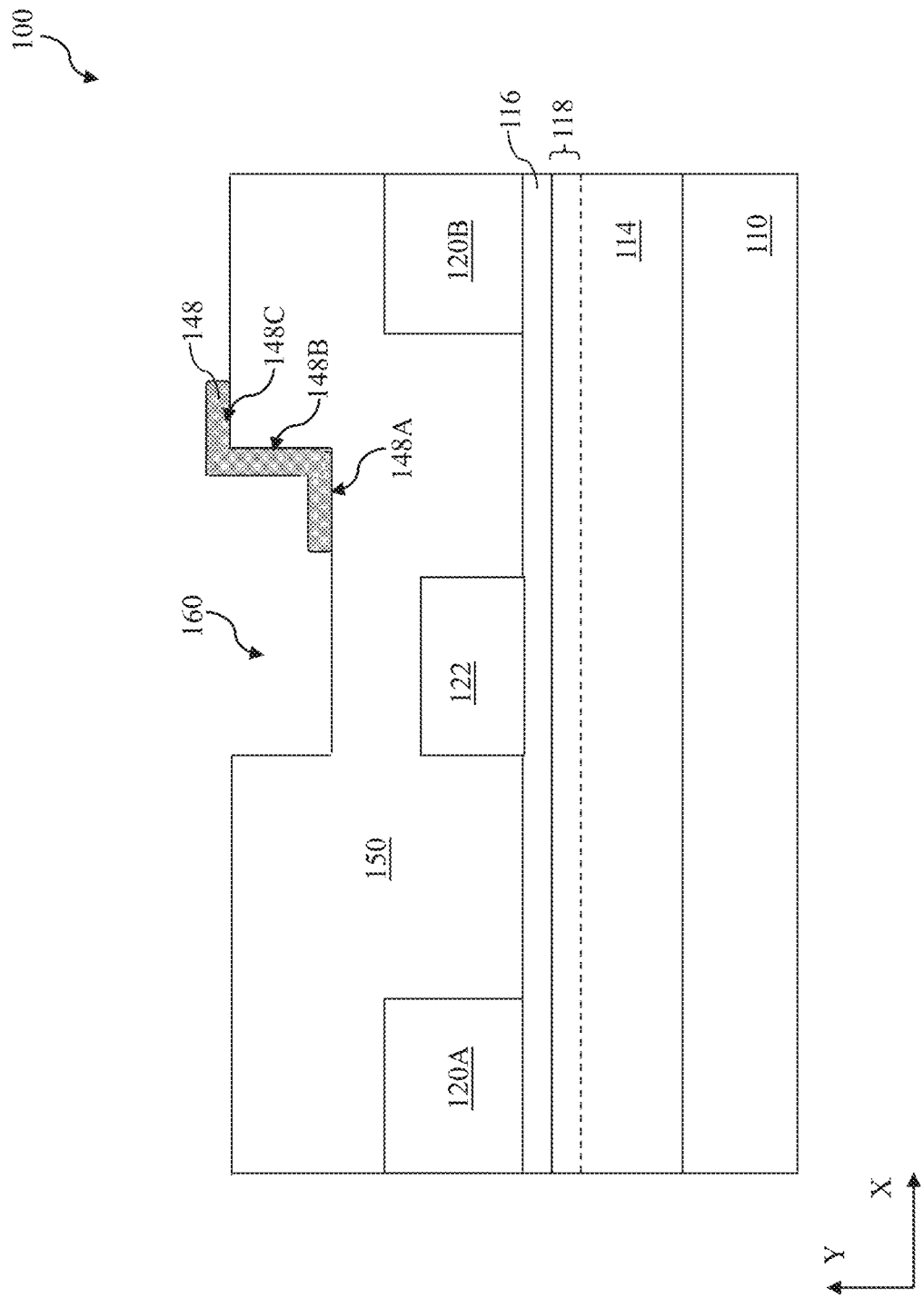

Referring to FIG. 16, the conductive layer 148 is patterned to form a field plate, also being labeled as 148. The field plate 148 has a step-wise structure. The patterning process is similar to the patterning process to pattern the first dielectric layer 150 but with different etchant(s) and processing conditions. For example, the patterning process may include a lithography process and etching, and may additionally use a patterned hard mask as an etch mask. In the depicted embodiment, the field plate 148 includes three segments 148A, 148B and 148C consecutively connected and alternatively oriented.

A multilayer interconnect structure is formed to electrically connect the field plate 148 to the source feature 120A. The multilayer interconnect structure is designed to couple various devices to form a functional integrated circuit. The multilayer interconnect structure includes vertical interconnects, such as vias or contacts, and horizontal interconnects, such as metal lines distributed in multiple metal layers. In the depicted embodiment, the multilayer interconnect structure includes conductive features 152 and 154 configured to electrically connect the field plate 148 to the source feature 120A. The multilayer interconnect structure may be configured differently with different conductive components to electrically connect the field plate 148 to the source feature 120A.

The formation of the multilayer interconnect structure may include any suitable technology or procedure. For examples, the multilayer interconnect structure may be formed by dual damascene process or single damascene process, such as those implemented in copper-based multilayer interconnection structure, alternatively by metal deposition and patterning process, such as those implemented in aluminum-based multilayer interconnect structure, or other suitable technology. The multilayer interconnect structure, especially the conductive features 152 and 154 thereof, is described below according to some embodiments.

Figure 17:
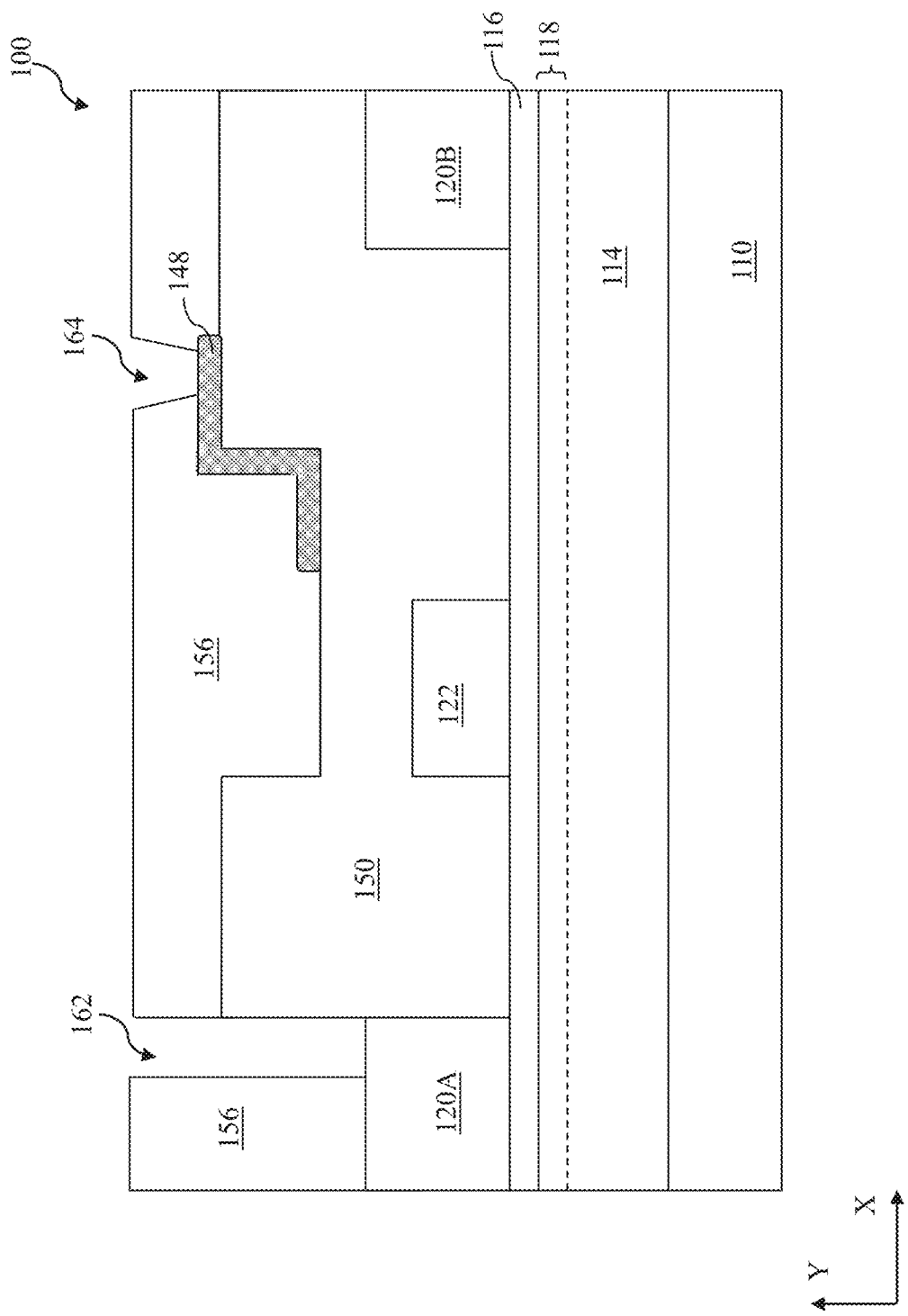

Referring to FIG. 17, a second dielectric layer 156 is formed on the first dielectric layer 150 and the field plate 148 by deposition, such as CVD, CVD, spin coating, ALD, other suitable deposition or a combination thereof, The second dielectric layer 156 may be similar to or different from the first dielectric layer 150 in composition, and may include one or more dielectric materials, such as silicon oxide, silicon nitride, a low k dielectric material, other suitable dielectric material, or a combination thereof. In some examples, the second dielectric layer 156 includes an etch-stop layer (such as silicon nitride) and a filling dielectric layer (such as silicon oxide or a low-k dielectric material) disposed on the etch-stop layer. In some embodiments, the formation of the second dielectric layer 156 includes deposition and CMP.

Still referring to FIG. 17, the second dielectric layer 156 is patterned to form trenches 162 and 164 to at least partially expose the source feature 120A and the field plate 148 within the respective trenches. The patterning process is similar to other patterning processes described above, and may include a lithography process and etch, and may additionally use a hard mask as an etch mask. In some embodiments, the trenches 162 and 164 may be separately formed or collectively formed with two or more lithography and etching processes.

Figure 18:
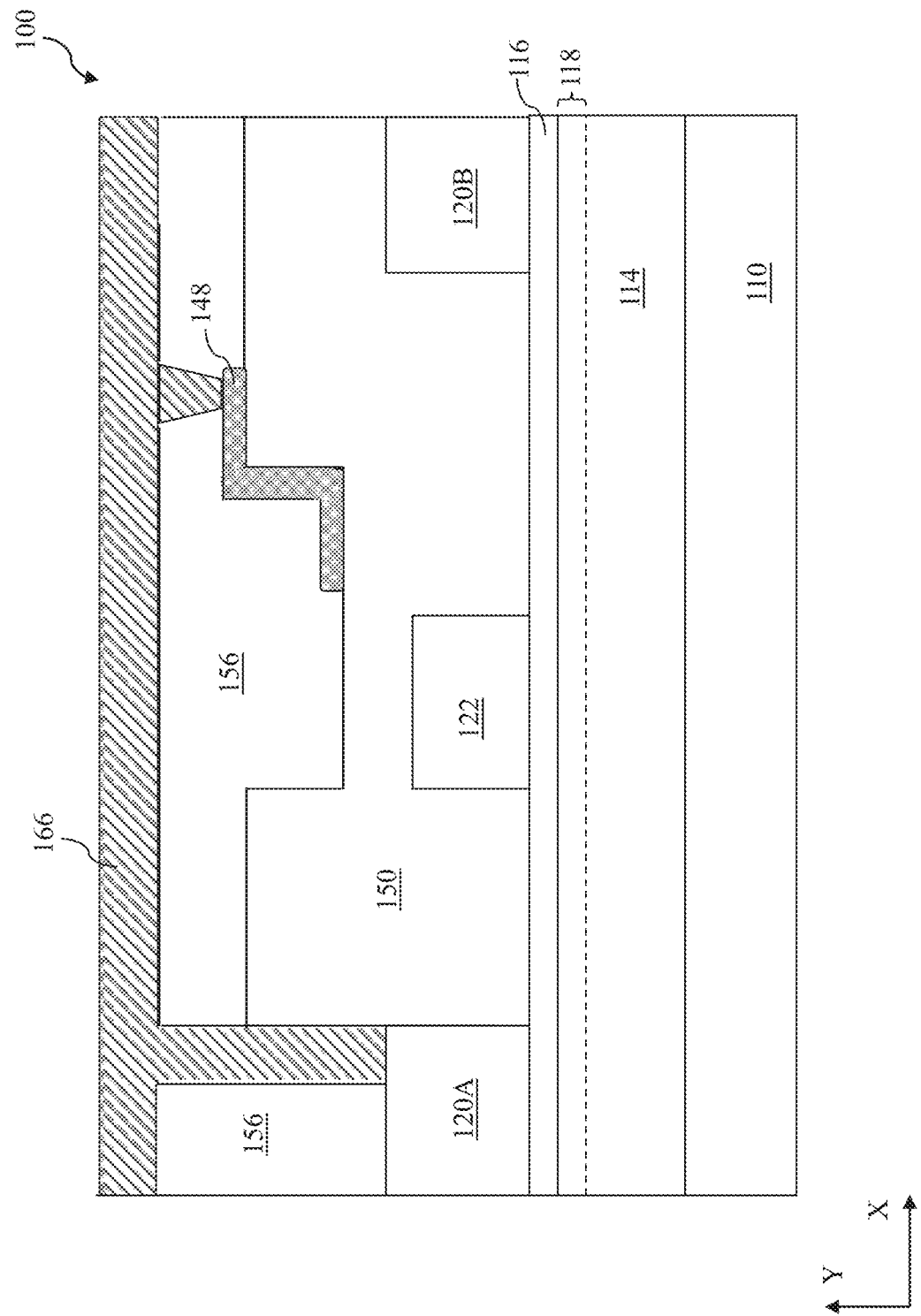

Referring to FIG. 18, one or more conductive material layer 166 is deposited in the trenches 162 and 164 and on the second dielectric layer 156 by a suitable deposition, such as PVD, CVD, plating, other suitable deposition or a combination thereof. For example, a seed layer is deposited by PVD in the trenches and an elelctroless plating process is applied to fill a metal in the trenches. In some embodiments, a reflow process at an elevated temperature may be applied to the conductive material for better trench filling effect.

Figure 19:
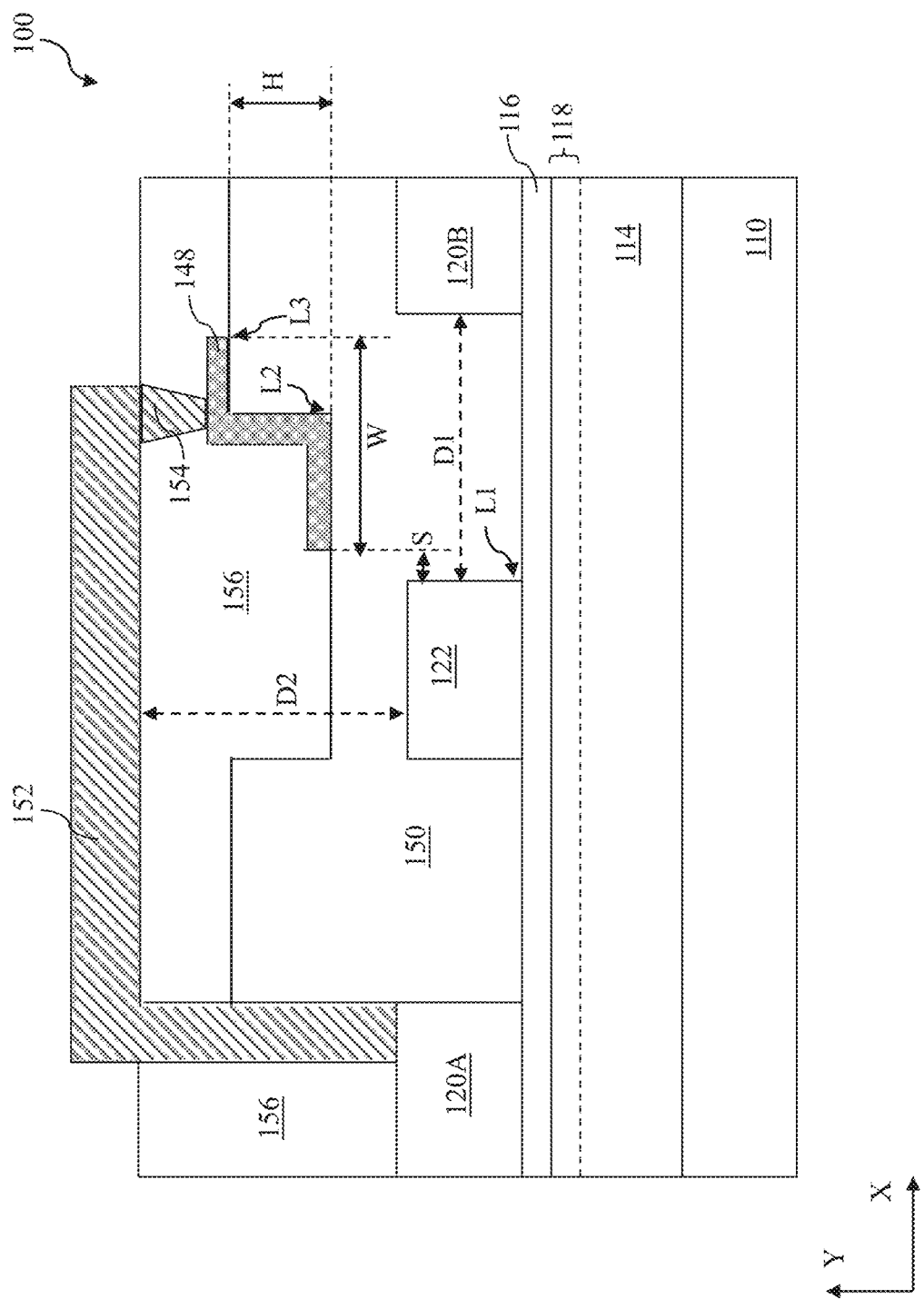

Referring to FIG. 19, the conductive material layer 166 is patterned to form the conductive features 152 and 154, by a procedure that includes a lithography process and etching. The patterning process is similar to other patterning processes described above, and may include a lithography process and etch, and may additionally use a hard mask as an etch mask.

In the semiconductor structure 100 of FIG. 19, the field plate 148 is not only designed and formed with a step-wise structure and also is configured with various dimensions and distances for optimized performance. Especially, the field plate 148 is designed to span a width W and span a height H, is placed to be horizontally distanced from the gate stack 122 with a spacing S. The drain feature 120B is distanced from the gate stack 122 with a first distance D1. The conductive feature 152 is distanced from the gate stack 122 with a second distance D2. All those dimensions are designed based on understanding of the electric field distribution, experiment data and theoretical analysis for improved performance including breakdown voltage and threshold voltage shift, such as those described in FIG. 28.

In some embodiments, the width W ranges between 0.25 μm and 5 µm, and the height H ranges between 30 nm and 500 nm. Particularly, it is found through our experiments that the concerned spots in the field plate are all located between drain and source. Accordingly, in some embodiments, the field plate 148 is designed to have a first ratio S/D1 is less than 1, such as 0≤S/D1≤95%; a second ratio W/D1 is greater than 5%, such as 5≤W/D1≤100%; and a third ratio H/D2 is less than 50%, such as 0≤H/D2≤50%. In some embodiments, the first ratio S/D1 ranges between 5% and 15%; the second ratio W/D1 ranges between 40% and 60%; and the third ratio H/D2 ranges between 5% and 15%.

Similarly, the field plate 148 in the semiconductor structure 180 of FIG. 1*b* is not only designed and formed with a step-wise structure and also is configured with various dimensions and distances for optimized performance. Especially, referring to FIG. 1*b*, the field plate 148 is designed to span a width W and span a height H, is placed to be horizontally distanced from the source feature 120A with a third distance D3. The source feature 120A and the drain feature 120B are distanced away with a fourth distance D4. The conductive feature 152 is distanced from the barrier layer 116 with a fifth distance D5. All those dimensions are designed based on understanding of the electric field distribution, experiment data and theoretical analysis for improved performance including breakdown voltage. Particularly, according to some embodiments, a fourth ratio D1/D4 is less than 1, such as 0≤S/D≤95%; a fifth ratio W/D4 is greater than 5%, such as 5≤W/D1≤100%; and a sixth ratio H/D5 is less than 50%, such as 0≤S/D≤50%. In some embodiments, the fourth ratio D1/D4 ranges between 50% and 70%; the fifth ratio W/D4 ranges between 20% and 30%; and the sixth ratio H/D5 ranges between 5% and 15%.

Figure 20:
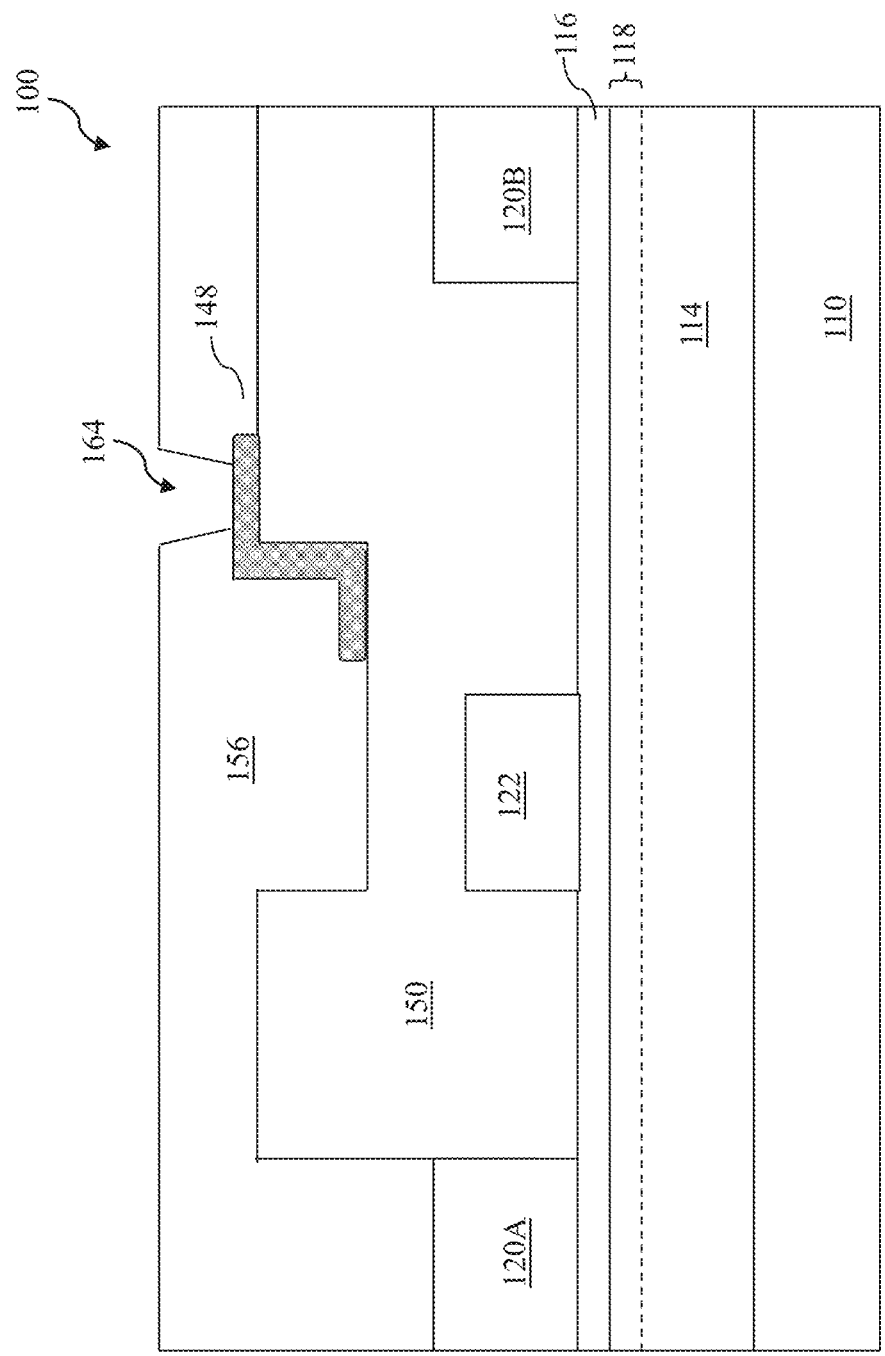
FIGS. 20 through 24 are sectional views of a semiconductor structure (such as those of FIGS. 1a, 9 and 10) at various fabrication stages according to various embodiments.
Figure 21:
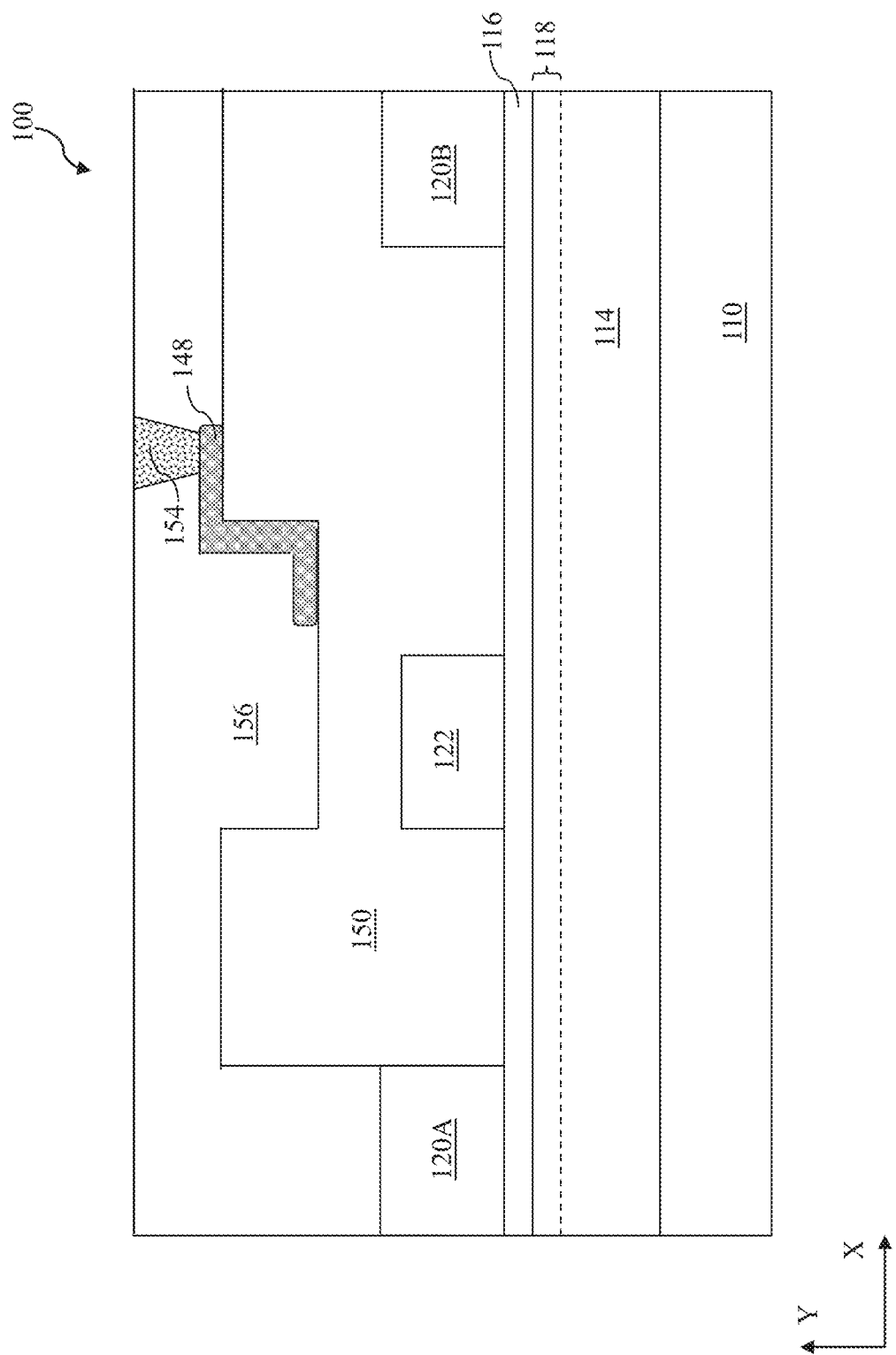
Figure 22:
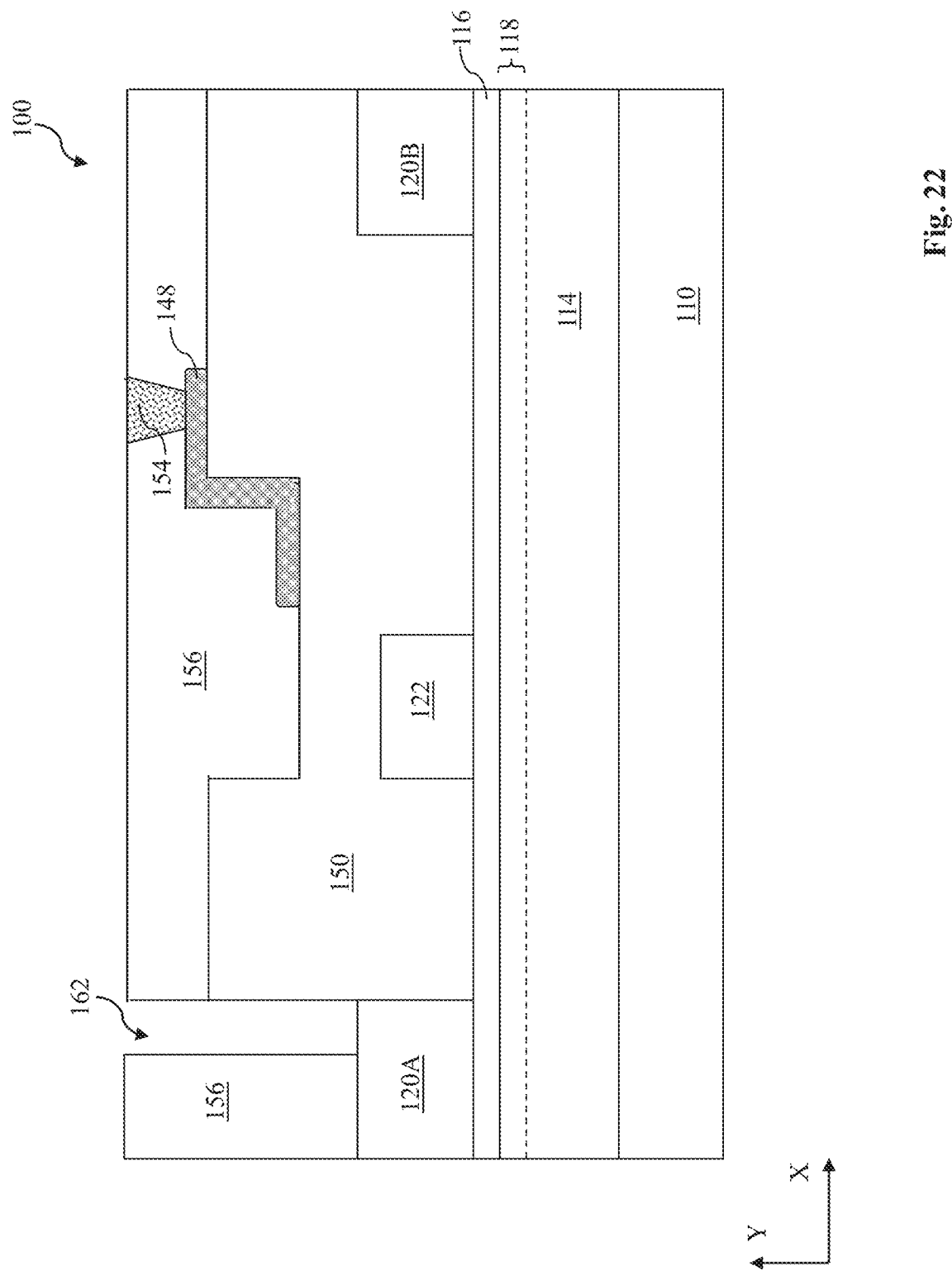
Figure 23:
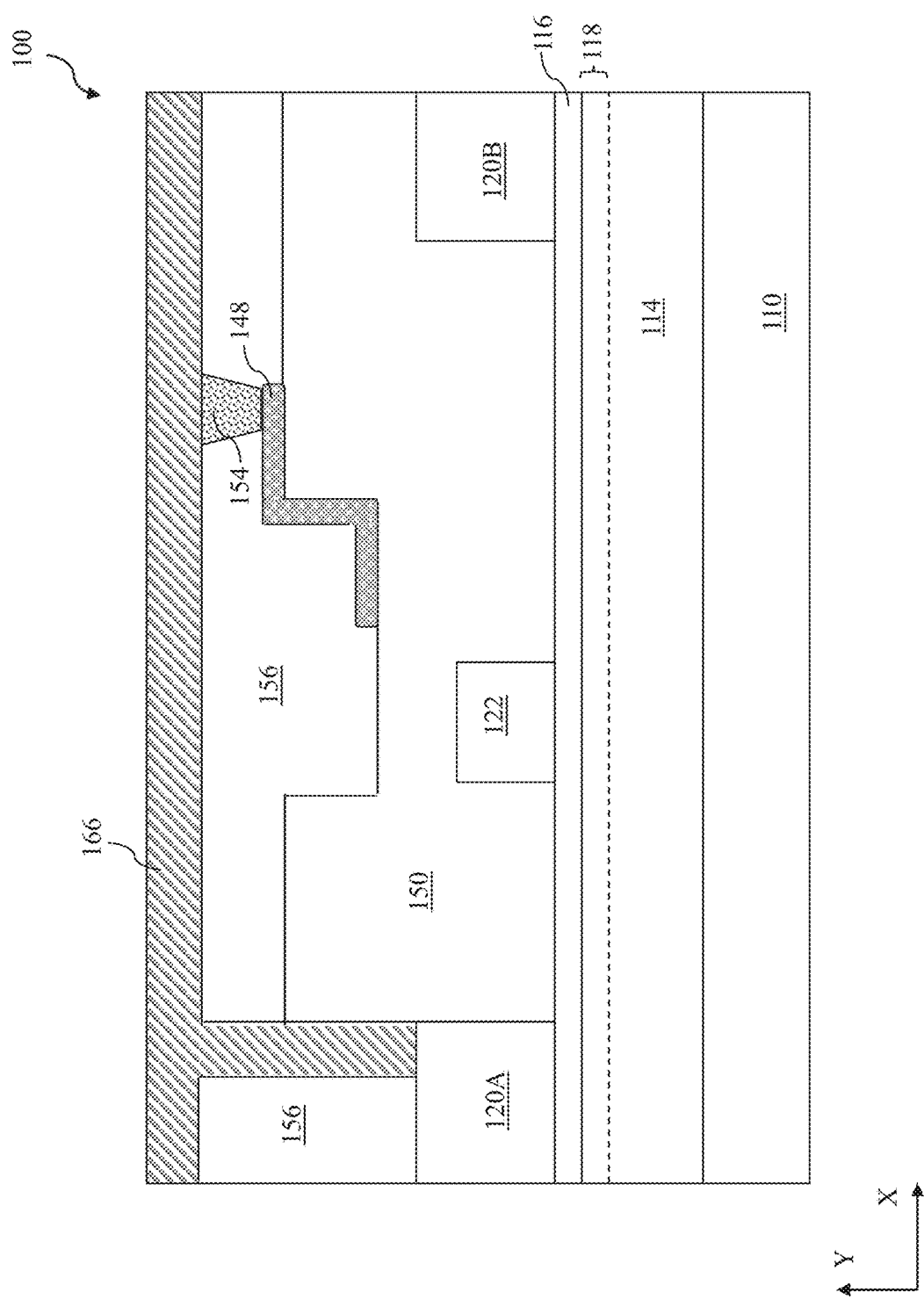
Figure 24:
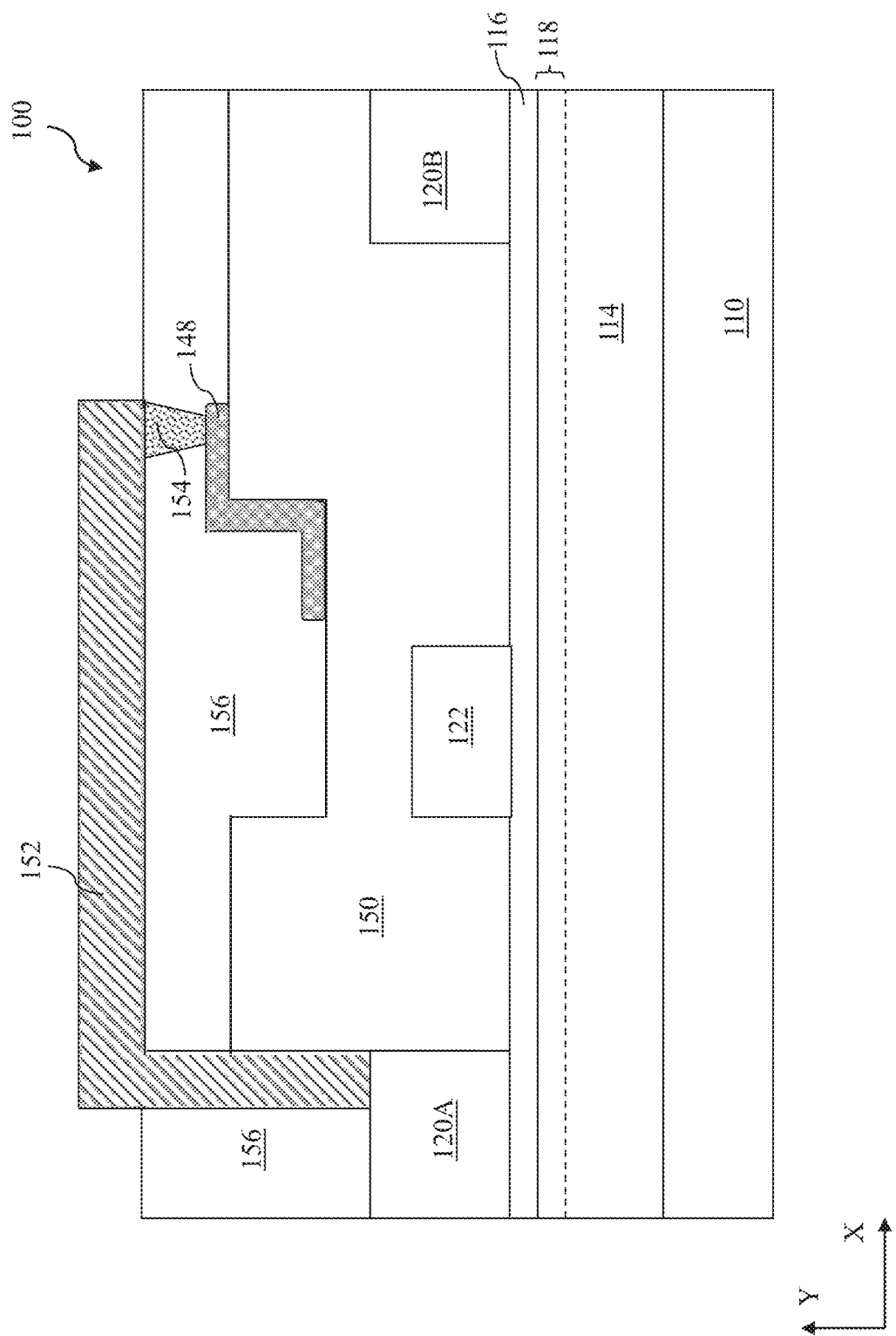

The conductive features 152 and 154 may be separately formed. One embodiment is provided with reference to FIGS. 20-24 in sectional views. The conductive feature 154 is formed by a single damascene process that includes patterning the second dielectric layer 156 to form a trench 164 as illustrated in FIG. 20; and filling one or more conductive material in the trench 164 by deposition; and performing a CMP process to remove the excessive conductive material on the second dielectric layer 156, thereby forming the conductive feature 154, as illustrated in FIG. 21. The conductive feature 152 is formed by a process that includes patterning the second dielectric layer 156 to form a trench 162, as illustrated in FIG. 22; depositing a conductive material layer 166 on the second dielectric layer 156 and in the trench 162 by a suitable deposition method, as illustrated in FIG. 23; and performing a patterning process to the conductive material layer 166 to form the conductive feature 152, as illustrated in FIG. 24.

Figure 25:
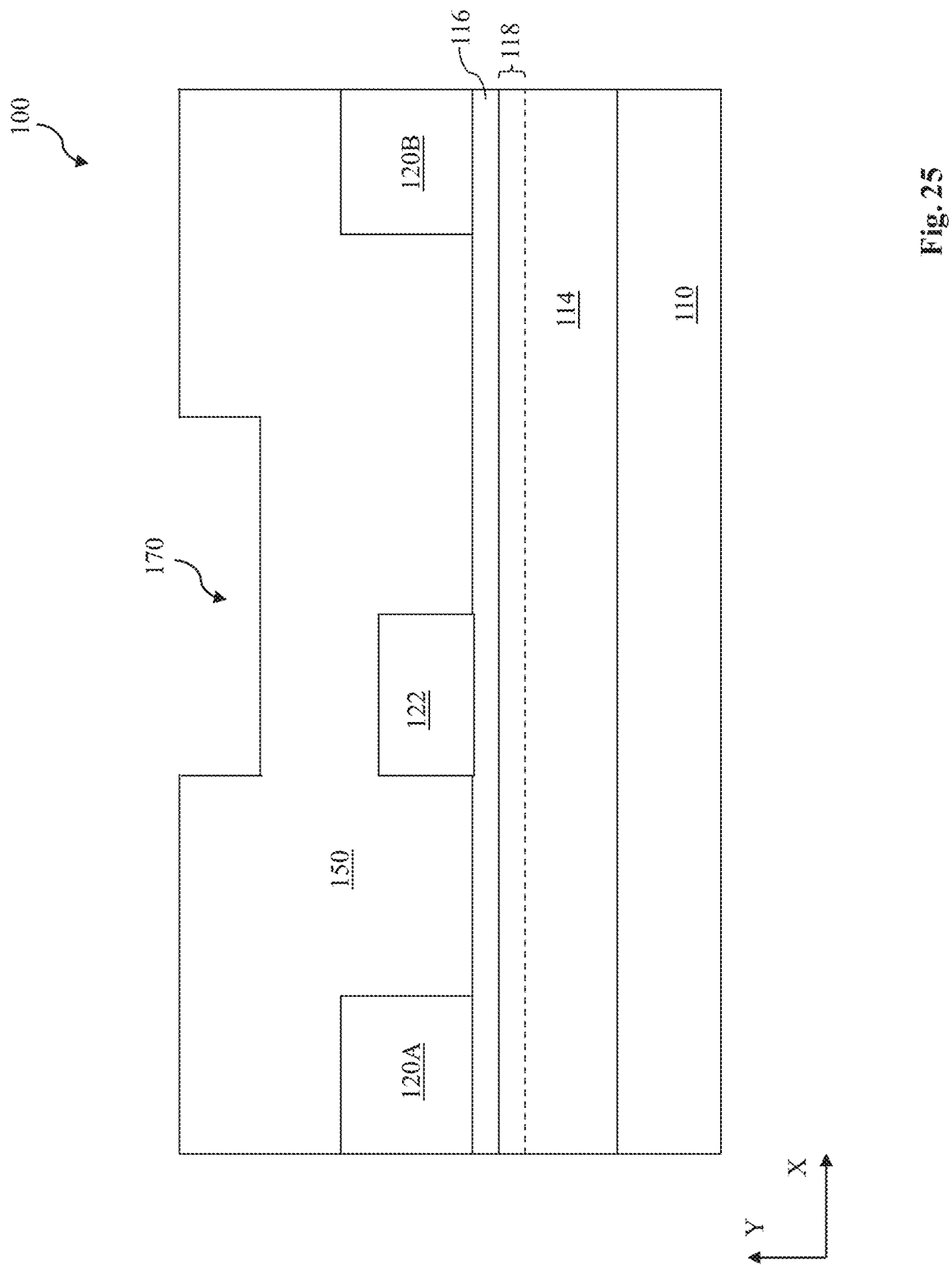
FIGS. 25 through 27 are sectional views of a semiconductor structure at various fabrication stages according to various embodiments.
Figure 26:
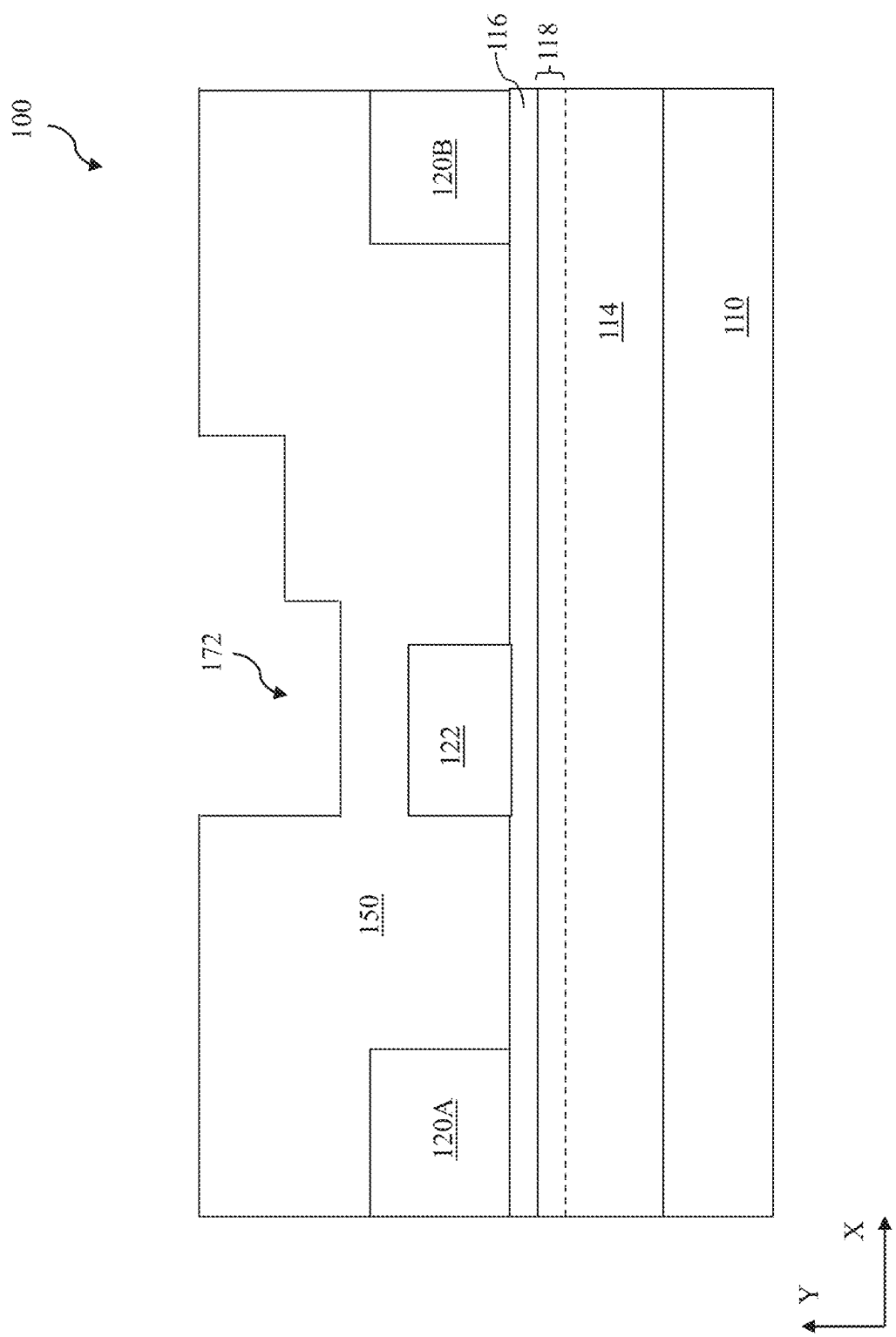
Figure 27:
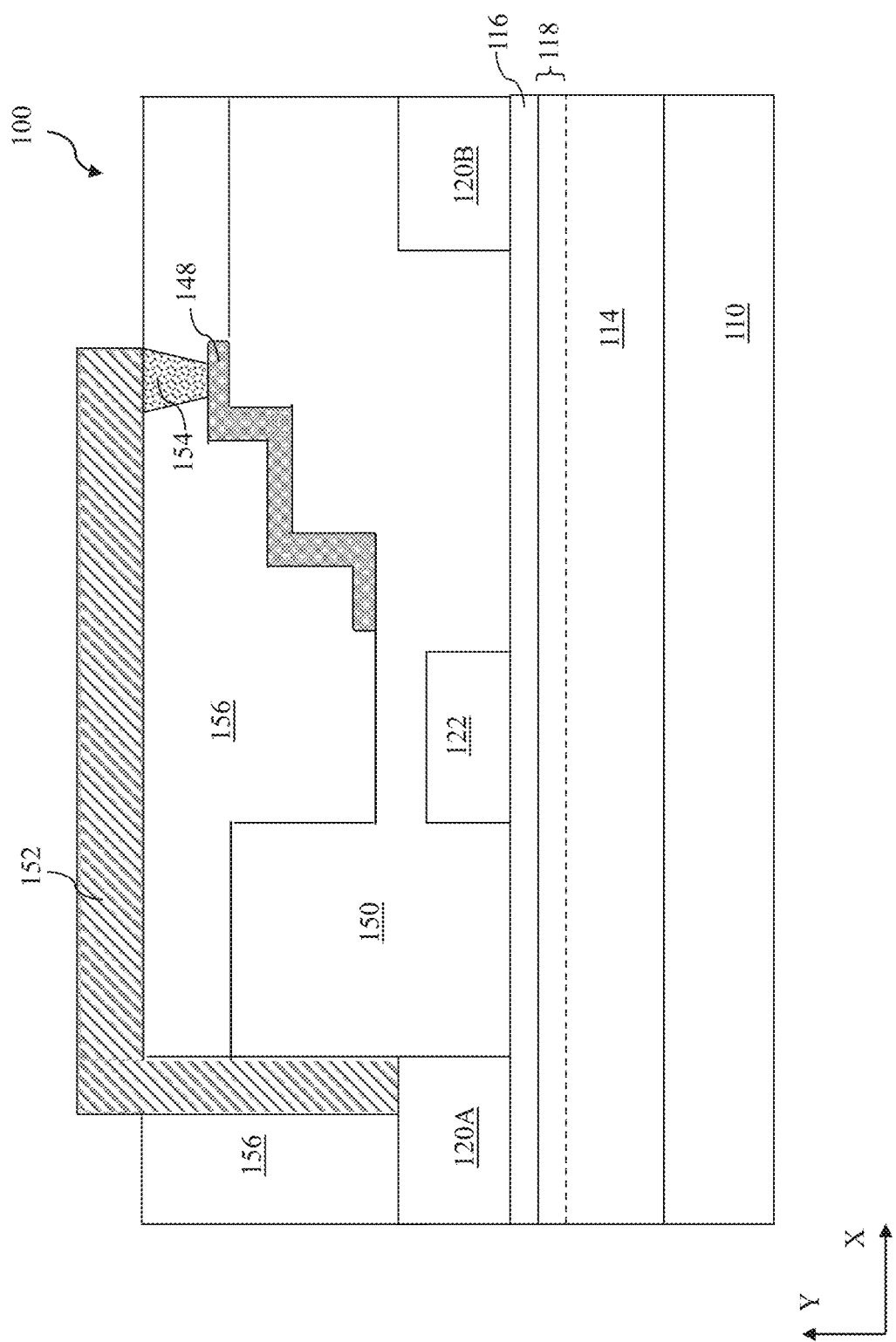

FIGS. 25-27 are sectional views of the semiconductor structure 100 constructed in accordance with some other embodiments. The semiconductor structure 100 in FIG. 27 is similar to the semiconductor structure 100 in FIG. 1*a*, 9, 10, 19 or 24 except for that the field plate 148 in FIG. 27 includes five segments consecutively connected and alternatively oriented on two orthogonal directions (X and Y directions) with a step-wise structure. Such field plate 148 can be formed by the method 200 but the block 206 includes two patterning processes applied to the first dielectric layer 150 to form a trench with a step-wise structure. Especially, a first patterning process is applied to the first dielectric layer 150 to form a trench 170 as illustrated in FIG. 25, and a second patterning process is further applied to the first dielectric layer 150 to form a trench 172 as illustrated in FIG. 26. Thereafter, the operations 208-212 are performed to form the field plate 148 as illustrated in FIG. 27. In alternative embodiments, the semiconductor structure 100 is a two-terminal device without the gate stack 122 but the field plate has a step-wise structure having five segments. In some embodiments, the field plate 148 in the semiconductor structure 100 may include a step-wise structure having 4, 6, 7, 8 or more segments formed by a similar procedure. For example, instead of two patterning processes for the dielectric material layer 150, the method may include three or more patterning processes for desired trench profile so that the field plate 148 can have various segments formed in the trench.

FIG. 28 is a diagrammatic view of the electric field (E-field) along X direction constructed according to some embodiments. The E-field intensity is presented by vertical axis. The graph (a) in FIG. 28 includes two sets of data, a first set labeled as "FP1" is associated with a semiconductor structure having a field plate with a disclosed step-wise structure (such as one in the semiconductor structure 100 in FIG. 19); and a second set labeled as "FP2" is associated with a semiconductor structure having a field plate have structure different than the step-wise structure as a reference. Specifically, the E-field for EP1 has three peaks at various locations, corresponding to the locations L1, L2 and L3 of FIG. 19, respectively. Especially, the second peak is contributed by the joint portion of the first and second segments of the field plate 148, which is lacking in the field plate with different structure. This redistributes the E-field and reduces the maximum E-field (at P3), thereby reducing the breakdown voltage accordingly. Due to the geometry of the step-wise structure of the disclosed field plate (such as 148 in FIG. 19), Various corner portions with edges of the field plate having a step-wise structure will contribute more to redistribute the E-field and reduce surface field, thereby reduce the breakdown voltage accordingly. The field plate 148 in FIG. 27 have a step-wise structure with five segments and more edge portions, which will more effectively redistribute the E-field and reduce surface field.

The graph (b) in FIG. 28 illustrates gate leakage current (Idoff) vs. gate voltage (Vd). The gate voltage is represented in horizontal axis and the gate leakage current is presented in vertical axis. The data show that the gate leakage current of the semiconductor structure with a field plate having a step-wise structure is substantially reduced.

The graph (c) in FIG. 28 illustrates dynamic Ronratio (or dRon ratio) vs. gate voltage (Vd). The gate voltage is represented in horizontal axis and the dynamic Ronratio is presented in vertical axis. The data show that the dynamic Ronratio of the semiconductor structure with a field plate having a step-wise structure is substantially increased. dRon ratio is dynamic Ron ratio. For example, dynamic Ron in 60V defines as Rds(60V)/Rds(1V). Rds(60V/1V) means Rds under continue transient switch stress Vds=60/1V. If the value is closer to 1, it means better channel trapping effect, in which AC Vds stress will induce less trapping in the channel.

Although various embodiments are provided and explained in the present disclosure. Other alternatives and embodiments may be used without departure from the spirit of the present disclosure. For example, the GaN-based device (such as 100, 180, 182 or 184) may further includes an aluminum nitride (AlN) layer disposed between the buffer layer 114 and the barrier layer 116. In one embodiment, the AlN layer is selectively epitaxy grown on the buffer layer 114. The AlN layer can be epitaxy grown by MOVPE using aluminum-containing precursor and nitrogen-containing precursor. The aluminum-containing precursor includes TMA, TEA, or other suitable chemical. The nitrogen-containing precursor includes ammonia, TBAm, phenyl hydrazine, or other suitable chemical. In one example, the AlN layer has a thickness ranging between about 5 nm and about 50 nm.

Alternatively, the AlN layer can replace the AlGaN layer as the barrier layer. In another embodiment, the dimensions of various n-GaN and p-GaN layers may vary according to the device's specification, performance, and circuit requirements. For example, the thicknesses of the various n-GaN and p-GaN layers can be adjusted according the threshold voltage or other device/circuit considerations. In another embodiment, the gate stack 122 of the semiconductor structure (such as 100, 182 or 184) may include more n-GaN and/or p-GaN layers configured in the junction isolation feature 126.

The present disclosure provides a III-V compound-based device having a field plate with a step-wise structure and the method making the same. The disclosed field plate has multiple segments consecutively connected and alternatively oriented in different directions. The disclosed field plate can effectively reduce surface field, thereby increasing breakdown voltage or sustaining high breakdown voltage, reducing leakage current, and lowering the shift of threshold voltage.

In one example aspect, the present disclosure provides a semiconductor structure. The semiconductor structure includes a gallium nitride (GaN) layer on a substrate; an aluminum gallium nitride (AlGaN) layer disposed on the GaN layer; a gate stack disposed on the AlGaN layer; a source feature and a drain feature disposed on the AlGaN layer and interposed by the gate stack; a dielectric material layer is disposed on the gate stack; and a field plate disposed on the dielectric material layer and electrically connected to the source feature, wherein the field plate includes a step-wise structure.

In another example aspect, the present disclosure provides a semiconductor structure. The semiconductor structure includes a first III-V compound layer on a substrate; a second III-V compound layer directly on the first III-V compound layer, the second III-V compound layer being different from the first III-V compound layer in composition and further including aluminum; a gate stack on the second III-V compound layer; a source feature and a drain feature disposed on the second III-V compound layer; and a field plate disposed over the gate stack and electrically connected to the source feature, wherein the field plate includes at least three segments with a step-wise structure.

In yet another example aspect, the present disclosure provides a method. The method includes forming a first III-V compound layer on a substrate; forming a second III-V compound layer on the first III-V compound layer, wherein the second III-V compound layer is different from the first III-V compound layer in composition and further includes aluminum; forming a gate stack on the second III-V compound layer; forming a source feature and a drain feature on the second III-V compound layer and interposed by the gate stack; and forming a field plate over the gate stack and electrically connected to the source feature, wherein the field plate includes at least three segments configured in a step-wise structure.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor structure, comprising:
   a gallium nitride (GaN) layer on a substrate and having a top surface with a plane normal direction oriented from the substrate to the GaN layer;
   an aluminum gallium nitride (AlGaN) layer disposed on the top surface of the GaN layer along the plane normal direction;
   a gate stack disposed on the AlGaN layer;
   a source feature and a drain feature disposed on the AlGaN layer and interposed by the gate stack;
   a first dielectric material layer disposed on the gate stack;
   a field plate disposed on the first dielectric material layer and electrically connected to the source feature, wherein the field plate includes a step-wise structure, wherein the step-wise structure includes a first segment extending horizontally along a first direction being perpendicular to the plane normal direction, a second segment extending vertically from the first segment along the plane normal direction, and a third segment extending horizontally from the second segment along the first direction, and wherein the third segment is above the first segment along the plane normal direction;
   a second dielectric material layer disposed on both the first dielectric material layer and the field plate;
   a first via on the source feature;
   a second via embedded in the second dielectric material layer and on the third segment of the field plate; and
   a metal line disposed on a topmost surface of the second dielectric material layer and above both the first and second vias along the plane normal direction and contacting both the first via and the second via, wherein
   the first via spans a first height along the plane normal direction,
   the second via spans a second height along the plane normal direction,
   the step-wise structure spans a third height along the plane normal direction, and
   the first height is greater than the sum of the second height and the third height.

2. The semiconductor structure of claim 1, wherein
   the second via includes a bottom surface and a top surface along the plane normal direction;
   the third segment includes a top surface being coplanar with the bottom surface of the second via;
   the metal line includes a bottom surface being coplanar with the top surface of the second via;
   the bottom surface of the second via spans a first lateral dimension along the first direction;
   the top surface of the third segment spans a second lateral dimension along the first direction;
   the second lateral dimension is greater than the first lateral dimension; and
   the step-wise structure is only electrically connected to the metal line through the second via.

3. The semiconductor structure of claim 2, wherein
   the metal line is extending along the first direction;
   the metal line is overlapped with the step-wise structure, the first via and the second via in a top view along the plane normal direction; and a bottom surface of the first via is below a bottom surface of the first segment along the plane normal direction.

4. The semiconductor structure of claim 3, wherein the first via is extending from the topmost surface of the second dielectric material layer to the source feature along the plane normal direction.

5. The semiconductor structure of claim 4, wherein the metal line is vertically distanced from the gate stack with a first dimension along the plane normal direction; the step-wise structure vertically spans a height along the plane normal direction; and a ratio of the height to the first dimension is less than 50%.

6. The semiconductor structure of claim 1, wherein the gate stack includes a III-V compound p-type doped layer.

7. The semiconductor structure of claim 6, wherein the gate stack further includes a III-V compound n-type doped layer adjacent the III-V compound p-type doped layer; and the III-V compound n-type doped layer includes an n-type GaN layer and the III-V compound p-type doped layer includes a p-type GaN layer.

8. The semiconductor structure of claim 1, wherein the first via spans between the source feature and the metal line along the plane normal direction; and the second via spans between the third segment and the metal line along plane normal direction.

9. The semiconductor structure of claim 8, wherein the III-V compound p-type doped layer is doped with an impurity selected from the group consisting of magnesium, calcium, zinc, beryllium, and carbon; and the III-V compound n-type doped layer is doped with an impurity selected from the group consisting of silicon and oxygen.

10. The semiconductor structure of claim 1, wherein the first via includes a bottom surface and a top surface along the plane normal direction; the first via includes a sidewall surface extending from the top surface to the bottom surface; and the sidewall surface of the first via is fully surrounded by the first and second dielectric material layers.

11. The semiconductor structure of claim 1, wherein the GaN layer is undoped or unintentionally doped.

12. The semiconductor structure of claim 1, wherein the source feature, the drain feature, and the gate stack are configured with the GaN layer and the AlGaN layer to form a high electron mobility transistor.

13. A semiconductor structure, comprising:
a first III-V compound layer on a substrate;
a second III-V compound layer on the first III-V compound layer, the second III-V compound layer being different from the first III-V compound layer in composition and further including aluminum;
a gate stack on the second III-V compound layer;
a source feature and a drain feature disposed on the second III-V compound layer;
a first via and a second via;
a field plate disposed over the gate stack and electrically connected to the source feature by way of the first via and the second via, wherein the field plate includes at least three segments with a step-wise structure, and wherein the first via is on the source feature, wherein the step-wise structure includes a first segment extending horizontally along a first direction, a second segment extending vertically from the first segment along a second direction being perpendicular to the first direction, and a third segment extending horizontally from the second segment along the first direction, wherein the second III-V compound layer is directly on the second III-V compound layer along the second direction, and wherein the third segment is above the first segment along the second direction and the second via is in contact with a topmost segment of the field plate along the second direction; and
a metal line disposed above and contacting both the first via and the second via along the second direction, wherein
the first via spans a first height along the second direction,
the second via spans a second height along the second direction,
the step-wise structure spans a third height along the second direction, and
the first height is greater than the sum of the second height and the third height.

14. The semiconductor structure of claim 13, wherein the first via includes a bottom surface and a top surface along the second direction;
the second via includes a bottom surface and a top surface along the second direction;
the metal line includes a bottom surface and a top surface along the second direction;
the bottom surface of the metal line contacts the top surface of the first via and the top surface of the second via;
the step-wise structure includes a top surface being coplanar with the bottom surface of the second via along the second direction;
the bottom surface of the second via spans a first lateral dimension along the first direction;
the top surface of the third segment spans a second lateral dimension along the first direction;
the second lateral dimension is greater than the first lateral dimension; and
the step-wise structure is only electrically connected to the metal line through the second via.

15. The semiconductor structure of claim 14, wherein the metal line is disposed over the step-wise structure along the second direction; and
the bottom surface of the first via is below a bottom surface of the first segment along the second direction.

16. A semiconductor structure, comprising:
a gallium nitride (GaN) layer on a substrate;
an aluminum gallium nitride (AlGaN) layer disposed on the GaN layer;
a gate stack disposed on the AlGaN layer, wherein the gate stack includes a junction isolation feature and a metal layer disposed on the junction isolation feature;
a source feature and a drain feature disposed on the AlGaN layer and interposed by the gate stack;
a dielectric material layer is disposed on the gate stack;
a field plate embedded in the dielectric material layer and electrically connected to the source feature, wherein the field plate includes a step-wise structure, wherein the step-wise structure includes a first segment extending horizontally along a first direction, a second segment extending vertically from the first segment along a second direction being perpendicular to the first direction, and a third segment extending horizontally from the second segment along the first direction, wherein the AlGaN layer is above and contacts the GaN layer along the second direction, the gate stack is above and contacts the AlGaN layer, and wherein the third segment is above the first segment along the second direction;

a first via embedded in the dielectric material layer, vertically landing on the source feature, and having a top surface and a bottom surface along the second direction;

a second via embedded in the dielectric material layer, vertically landing on the third segment, and having a top surface and a bottom surface along the second direction; and a metal line disposed on a top surface of the dielectric material layer along the second direction, and contacting the top surface of the first via and the top surface of the second via, wherein the first via spans a first height along the second direction, the second via spans a second height along the second direction, the step-wise structure spans a third height along the second direction, and the first height is greater than the sum of the second height and the third height.

17. The semiconductor structure of claim 16, wherein a top surface of the third segment is coplanar with a bottom surface of the second via;

the bottom surface of the second via spans a first lateral dimension along the first direction;

the top surface of the third segment spans a second lateral dimension along the first direction;

the second lateral dimension is greater than the first lateral dimension;

the step-wise structure is only electrically connected to the metal line through the second via; and the metal line is overlapped with the first via and the second via in a top view.

18. The semiconductor structure of claim 16, wherein the first via spans between the source feature and the metal line along the second direction;

the second via spans between the third segment and the metal line along the second direction; and a bottom surface of the first via is below a bottom surface of the first segment along the second direction.

19. The semiconductor structure of claim 16, wherein the junction isolation feature includes two p-type doped GaN layers and two n-type doped GaN layers alternatively stacked;

each of the two p-type doped GaN layers is doped with an impurity selected from the group consisting of magnesium, calcium, zinc, beryllium, and carbon; and each of the two n-type doped GaN layers is doped with an impurity selected from the group consisting of silicon and oxygen.

20. The semiconductor structure of claim 1, wherein the top surface of the second dielectric material layer is above a topmost surface of the field plate along the plane normal direction; and the first via extending from the top surface of the dielectric layer to the source feature along the plane normal direction.

* * * * *